US007139864B2

(12) United States Patent
Bennett et al.

(10) Patent No.: US 7,139,864 B2
(45) Date of Patent: Nov. 21, 2006

(54) NON-VOLATILE MEMORY AND METHOD WITH BLOCK MANAGEMENT SYSTEM

(75) Inventors: Alan David Bennett, Edinburgh (GB); Alan Douglas Bryce, Edinburgh (GB); Sergey Gorobets, Edinburgh (GB); Alan Welsh Sinclair, Falkirk (GB); Peter John Smith, Scotland (GB)

(73) Assignee: SanDisk Corporation, Milpitas, CA (US)

( * ) Notice: Subject to any disclaimer, the term of this patent is extended or adjusted under 35 U.S.C. 154(b) by 539 days.

(21) Appl. No.: 10/750,155

(22) Filed: Dec. 30, 2003

(65) Prior Publication Data
US 2005/0144360 A1 Jun. 30, 2005

(51) Int. Cl.
G06F 12/00 (2006.01)

(52) U.S. Cl. .................. 711/103; 711/100; 711/102; 711/165; 711/200; 711/203; 711/209; 365/185.11; 365/230.03

(58) Field of Classification Search ........ 711/102–103, 711/165
See application file for complete search history.

(56) References Cited

U.S. PATENT DOCUMENTS

| 5,043,940 A | 8/1991 | Harari |
| 5,070,032 A | 12/1991 | Yuan et al. |
| 5,095,344 A | 3/1992 | Harari |
| 5,172,338 A | 12/1992 | Mehrotra et al. |
| 5,313,421 A | 5/1994 | Guterman et al. |
| 5,315,541 A | 5/1994 | Harari et al. |
| 5,343,063 A | 8/1994 | Yuan et al. |
| 5,367,484 A | 11/1994 | Alexander et al. |
| 5,404,485 A * | 4/1995 | Ban ........................ 711/202 |
| 5,532,962 A | 7/1996 | Auclair et al. |
| 5,570,315 A | 10/1996 | Tanaka et al. |
| 5,661,053 A | 8/1997 | Yuan |
| 5,742,934 A * | 4/1998 | Shinohara ................... 711/103 |
| 5,751,634 A | 5/1998 | Itoh |
| 5,768,192 A | 6/1998 | Eitan |
| 5,774,397 A | 6/1998 | Endoh et al. |

(Continued)

FOREIGN PATENT DOCUMENTS

EP 0887732 12/1998

(Continued)

OTHER PUBLICATIONS

USPTO, "Office Action," mailed in related U.S. Appl. No. 10/841,118, filed Jun. 16, 2006, 29 pages.

(Continued)

Primary Examiner—Matthew Kim
Assistant Examiner—Zhuo H. Li
(74) Attorney, Agent, or Firm—Parsons Hsue & de Runtz LLP

(57) ABSTRACT

A non-volatile memory system is organized in physical groups of physical memory locations. Each physical group (metablock) is erasable as a unit and can be used to store a logical group of data. A memory management system allows for update of a logical group of data by allocating a metablock dedicated to recording the update data of the logical group. The update metablock records update data in the order received and has no restriction on whether the recording is in the correct logical order as originally stored (sequential) or not (chaotic). Eventually the update metablock is closed to further recording. One of several processes will take place, but will ultimately end up with a fully filled metablock in the correct order which replaces the original metablock. In the chaotic case, directory data is maintained in the non-volatile memory in a manner that is conducive to frequent updates. The system supports multiple logical groups being updated concurrently.

32 Claims, 29 Drawing Sheets

U.S. PATENT DOCUMENTS

| | | | |
|---|---|---|---|
| 5,798,968 | A | 8/1998 | Lee et al. |
| 5,860,124 | A * | 1/1999 | Matthews et al. .......... 711/165 |
| 5,890,192 | A | 3/1999 | Lee et al. |
| 5,903,495 | A | 5/1999 | Takeuchi et al. |
| 5,907,856 | A | 5/1999 | Estakhri et al. |
| 5,909,449 | A | 6/1999 | So et al. |
| 5,930,167 | A | 7/1999 | Lee et al. |
| 5,937,425 | A | 8/1999 | Ban |
| 6,011,725 | A | 1/2000 | Eitan |
| 6,034,897 | A | 3/2000 | Estakhri et al. |
| 6,046,935 | A | 4/2000 | Takeuchi et al. |
| 6,125,435 | A | 9/2000 | Estakhri et al. |
| 6,141,249 | A | 10/2000 | Estakhri et al. |
| 6,222,762 | B1 | 4/2001 | Guterman et al. |
| 6,226,728 | B1 | 5/2001 | See et al. |
| 6,272,610 | B1 | 8/2001 | Katayama et al. |
| 6,377,500 | B1 | 4/2002 | Fujimoto et al. |
| 6,401,160 | B1 | 6/2002 | See et al. |
| 6,421,279 | B1 | 7/2002 | Tobita et al. |
| 6,426,893 | B1 | 7/2002 | Conley et al. |
| 6,456,528 | B1 | 9/2002 | Chen |
| 6,490,649 | B1 | 12/2002 | Sinclair |
| 6,522,580 | B1 | 2/2003 | Chen et al. |
| 6,563,734 | B1 | 5/2003 | Taki |
| 6,567,307 | B1 * | 5/2003 | Estakhri ................ 365/185.11 |
| 6,591,330 | B1 | 7/2003 | Lasser |
| 6,725,321 | B1 | 4/2004 | Sinclair et al. |
| 6,763,424 | B1 * | 7/2004 | Conley ........................ 711/103 |
| 6,871,259 | B1 * | 3/2005 | Hagiwara et al. ........... 711/103 |
| 6,895,464 | B1 | 5/2005 | Chow et al. |
| 6,898,662 | B1 | 5/2005 | Gorobets |
| 2002/0099904 | A1 | 7/2002 | Conley |
| 2003/0053334 | A1 | 3/2003 | Chen |
| 2003/0065899 | A1 * | 4/2003 | Gorobets .................... 711/165 |
| 2003/0109093 | A1 | 6/2003 | Harari et al. |
| 2003/0110343 | A1 | 6/2003 | Masato et al. |
| 2004/0103241 | A1 * | 5/2004 | Chang et al. ............... 711/103 |
| 2005/0141312 | A1 | 6/2005 | Sinclair et al. |
| 2005/0141313 | A1 | 6/2005 | Gorobets et al. |
| 2005/0143365 | A1 | 6/2005 | Gorobets et al. |
| 2005/0144357 | A1 | 6/2005 | Sinclair |
| 2005/0144358 | A1 | 6/2005 | Conley et al. |
| 2005/0144363 | A1 | 6/2005 | Sinclair |
| 2005/0144367 | A1 | 6/2005 | Sinclair |
| 2005/0166087 | A1 | 7/2005 | Gorobets |

FOREIGN PATENT DOCUMENTS

| | | |
|---|---|---|
| EP | 0 977 121 A2 | 2/2000 |
| EP | 1424631 A1 | 6/2004 |
| JP | 5314019 | 11/1993 |
| WO | WO 00/049488 | 8/2000 |
| WO | WO 02/058074 A2 | 7/2002 |
| WO | WO 03/027828 | 4/2003 |
| WO | WO 03/029951 A2 | 4/2003 |
| WO | WO2004/040457 A1 | 5/2004 |
| WO | WO2004/040458 A1 | 5/2004 |
| WO | WO2004/040459 A1 | 5/2004 |
| WO | WO2004/040578 A1 | 5/2004 |

OTHER PUBLICATIONS

USPTO, "Office Action," mailed in related U.S. Appl. No. 10/749,189, filed Apr. 28, 2006, 13 pages.

EPO/ISA, "Notification of Transmittal of the International Search Report and the Written Opinion of the International Searching Authority, or the Declaration" mailed in related PCT/US2004/043762 (published as WO 2005/066793 A2) on Apr. 4, 2006, 14 pages.

Taiwanese Patent Office, "Preliminary Notice of Rejection of the IPO," mailed in related Taiwanese patent application No. 093141438 on Mar. 17, 2006, 2 pages.

EPO/ISA, "Invitation to Pay Additional Fees, Communication Relating to the Results of the Partial International Search Report", mailed in related International Application No. PCT/US2004/043762 on Dec. 8, 2005, 5 pages.

EPO/ISA, "Notification of the Transmittal of the International Search Report and the Written Opinion of the International Searching Authority, or the Declaration", mailed in related International Application No. PCT/US2004/043377 on Dec. 2, 2005, 10 pages.

Bennett et al., "Scratch Pad Block", U.S. Appl. No. 11/016,285, filed Dec. 16, 2004, 55 pages.

Chang, Li-Pin et al., "An Adaptive Striping Architecture for Flash Memory Storage Systems of Embedded Systems", Proceedings of the Eighth IEEE Real-Time and Embedded Technology and Applications Symposium, Sep. 24, 2002, pp. 187-196.

EPO/ISA, "Notification of Transmittal of the International Search Report and the Written Opinion of the International Searching Authority, or the Declaration", mailed in related PCT/US2004/043597 on Aug. 8, 2005, 12 pages.

EPO/ISA, "Notification of Transmittal of the International Search Report and the Written Opinion of the International Searching Authority, or the Declaration", mailed in related PCT/US2004/043680 on Sep. 23, 2005, 18 pages.

ISA/EPO, "Communication Relating to the Results of the Partial International Search," mailed in related PCT/US2004/043680 on Jul. 5, 2005, 3 pages.

EPO/ISA, "Notification of Transmittal of the International Search Report and the Written Opinion of the International Searching Authority, or the Declaration", mailed in related PCT/US2004/043692 on May 4, 2005, 9 pages.

Eitan et al., "NROM: A Novel Localized Trapping, 2-Bit Nonvolatile Memory Cell," IEE Electron Device Letters, vol. 21, No. 1, Nov. 2000, pp. 543-545.

* cited by examiner

**SEQUENTIAL UPDATE
Example**

CHAOTIC UPDATE
(NONSEQUENTIAL)
Example

FORCED SEQUENTIAL UPDATE Example

| LOGICAL GROUP STATE | DESCRIPTION |
|---|---|
| Intact | Complete Logical Group in logically sequential order in a single metablock |
| Unwritten | No portion of the Logical Group has ever been written |
| Sequential Update | An update segment of the Logical Group is written to an update block without changing its existing sequential nature |
| Chaotic Update | An update segment of the Logical Group is written to an update block in logically non-sequential order |

*FIG. 12B*

PHYSICAL METABLOCK STATES

| METABLOCK STATE | DESCRIPTION |
|---|---|
| Erased | All the sectors in the metablock are erased |
| Sequential Update | The metablock is partially written with sectors in logically sequential order, possibly using page tag. All the sectors belong to the same logical group. |
| Non-sequential (Chaotic) Update | The metablock is partially or fully written with sectors in logically non-sequential order. Any sector can be written more than once. All sectors belong to the same logical group |
| Intact | The metablock is fully written in logically sequential order, possibly using page tag |
| Original | The metablock was previously Intact but at least one sector has been made obsolete by a host data update |

Chaotic Block Index (CBI) Sector

| Chaotic Block Index | Chaotic Block Info | CBI Sector Index |
|---|---|---|

Address Translation

Operations on Control Data Structures

NON-VOLATILE MEMORY AND METHOD WITH BLOCK MANAGEMENT SYSTEM

FIELD OF THE INVENTION

This invention relates generally to non-volatile semiconductor memory and specifically to those having a memory block management system.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543–545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In flash memory systems, erase operation may take as much as an order of magnitude longer than read and program operations. Thus, it is desirable to have the erase block of substantial size. In this way, the erase time is amortized over a large aggregate of memory cells.

The nature of flash memory predicates that data must be written to an erased memory location. If data of a certain logical address from a host is to be updated, one way is rewrite the update data in the same physical memory location. That is, the logical to physical address mapping is unchanged. However, this will mean the entire erase block contain that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

Another problem with managing flash memory system has to do with system control and directory data. The data is produced and accessed during the course of various memory operations. Thus, its efficient handling and ready access will directly impact performance. It would be desirable to maintain this type of data in flash memory because flash memory is meant for storage and is nonvolatile. However, with an intervening file management system between the controller and the flash memory, the data can not be accessed as directly. Also, system control and directory data tends to be active and fragmented, which is not conducive to storing in a system with large size block erase. Conventionally, this type of data is set up in the controller RAM, thereby allowing direct access by the controller. After the memory device is powered up, a process of initialization enables the flash memory to be scanned in order to compile the necessary system control and directory information to be placed in the controller RAM. This process takes time and requires controller RAM capacity, all the more so with ever increasing flash memory capacity.

U.S. Pat. No. 6,567,307 discloses a method of dealing with sector updates among large erase block including recording the update data in multiple erase blocks acting as scratch pad and eventually consolidating the valid sectors among the various blocks and rewriting the sectors after rearranging them in logically sequential order. In this way, a block needs not be erased and rewritten at every slightest update.

WO 03/027828 and WO 00/49488 both disclose a memory system dealing with updates among large erase block including partitioning the logical sector addresses in zones. A small zone of logical address range is reserved for active system control data separate from another zone for user data. In this way, manipulation of the system control data in its own zone will not interact with the associated user data in another zone. Updates are at the logical sector level and a write pointer points to the corresponding physical sectors in a block to be written. The mapping information is buffered in RAM and eventually stored in a sector allocation table in the main memory. The latest version of a logical sector will obsolete all previous versions among existing blocks, which become partially obsolete. Garbage collection is performed to keep partially obsolete blocks to an acceptable number.

Prior art systems tend to have the update data distributed over many blocks or the update data may render many existing blocks partially obsolete. The result often is a large amount of garbage collection necessary for the partially obsolete blocks, which is inefficient and causes premature aging of the memory. Also, there is no systematic and efficient way of dealing with sequential update as compared to non-sequential update.

Therefore there is a general need for high capacity and high performance non-volatile memory. In particular, there is a need to have a high capacity nonvolatile memory able to conduct memory operations in large blocks without the aforementioned problems.

SUMMARY OF INVENTION

A non-volatile memory system is organized in physical groups of physical memory locations. Each physical group (metablock) is erasable as a unit and can be used to store a logical group of data. A memory management system allows for update of a logical group of data by allocating a metablock dedicated to recording the update data of the logical group. The update metablock records update data in the order received and has no restriction on whether the recording is in the correct logical order as originally stored (sequential) or not (chaotic). Eventually the update metablock is closed to further recording. One of several processes will take place, but will ultimately end up with a fully filled metablock in the correct order which replaces the original metablock. In the chaotic case, directory data is maintained in the non-volatile memory in a manner that is conducive to frequent updates. The system supports multiple logical groups being updated concurrently.

One feature of the invention allows data to be updated logical-group by logical-group. Thus, when a logical group is being updated, the distribution of logical units (and also the scatter of memory units that the updates obsolete) are limited in range. This is especially true when the logical group is normally contained within a physical block.

During updates of the logical group, typically one or two blocks need be assigned to buffer the updated logical units. Thus, garbage collection need only be performed over a relatively fewer number of blocks. Garbage collection of a chaotic block may be performed by either consolidation or compaction.

The economy of the update process is further evident in the generic treatment of the update blocks so that no additional block need be assigned for chaotic (non-sequential) updates as compared to the sequential ones. All update blocks are allocated as sequential update block, and any update block can change to a chaotic update block. Indeed, the change of an update block from sequential to chaotic is discretionary.

The efficient use of system resource allows multiple logical groups to be updated concurrently. This further increases efficiency and reduces overheads.

Additional features and advantages of the present invention will be understood from the following description of its preferred embodiments, which description should be taken in conjunction with the accompanying drawings.

BRIEF DESCRIPTION OF THE DRAWINGS

FIG. 12B is a table listing the possible states of a Logical Group.

FIG. 13B is a table listing the possible states of a metablock.

FIGS. 14(A)–14(J) are state diagrams showing the effect of various operations on the state of the logical group and also on the physical metablock.

DETAILED DESCRIPTION OF THE PREFERRED EMBODIMENTS

Figure 1:
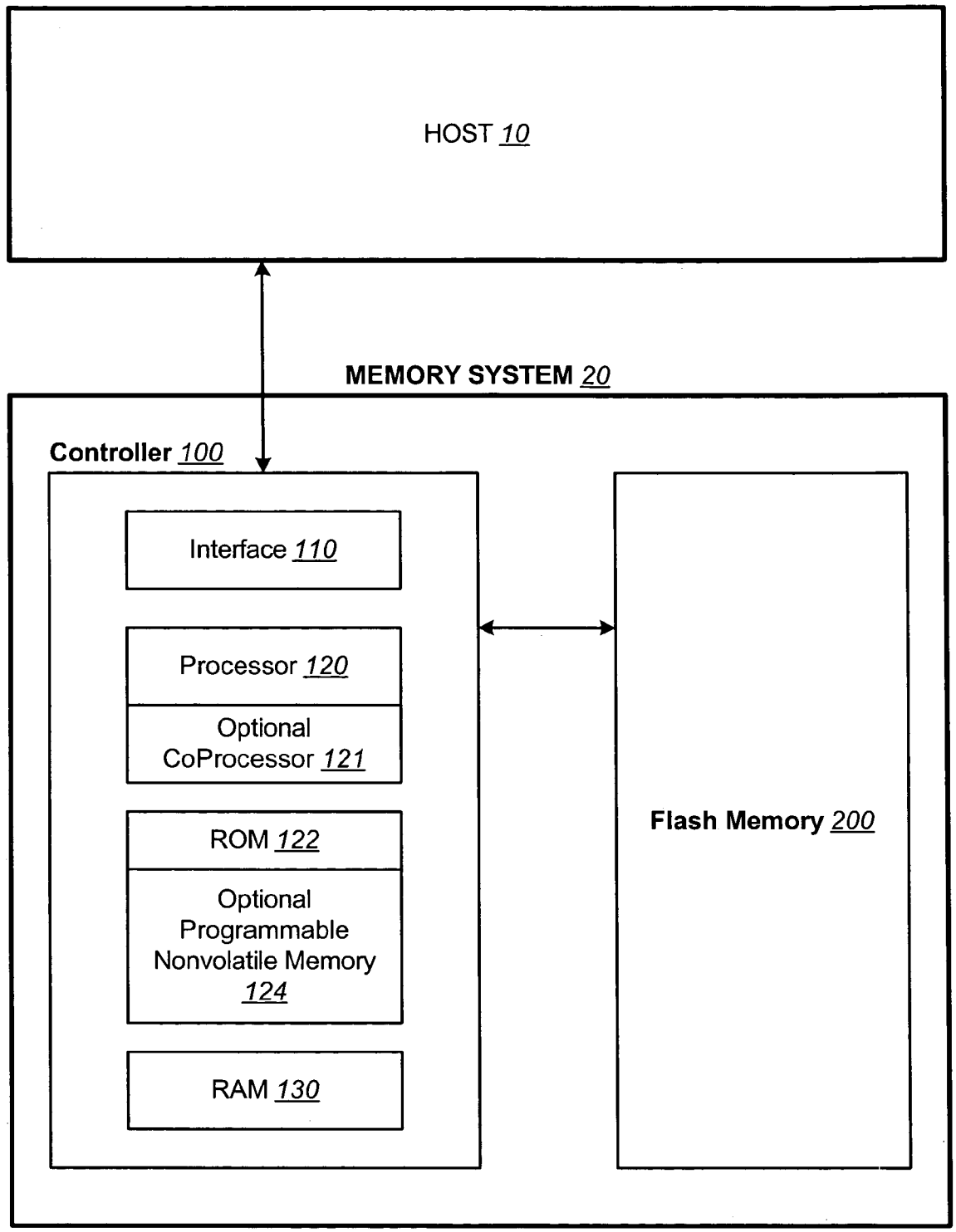
FIG. 1 illustrates schematically the main hardware components of a memory system suitable for implementing the present invention.

FIG. 1 illustrates schematically the main hardware components of a memory system suitable for implementing the present invention. The memory system 20 typically operates with a host 10 through a host interface. The memory system is typically in the form of a memory card or an embedded memory system. The memory system 20 includes a memory 200 whose operations are controlled by a controller 100. The memory 200 comprises of one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Logical and Physical Block Structures

Figure 2:
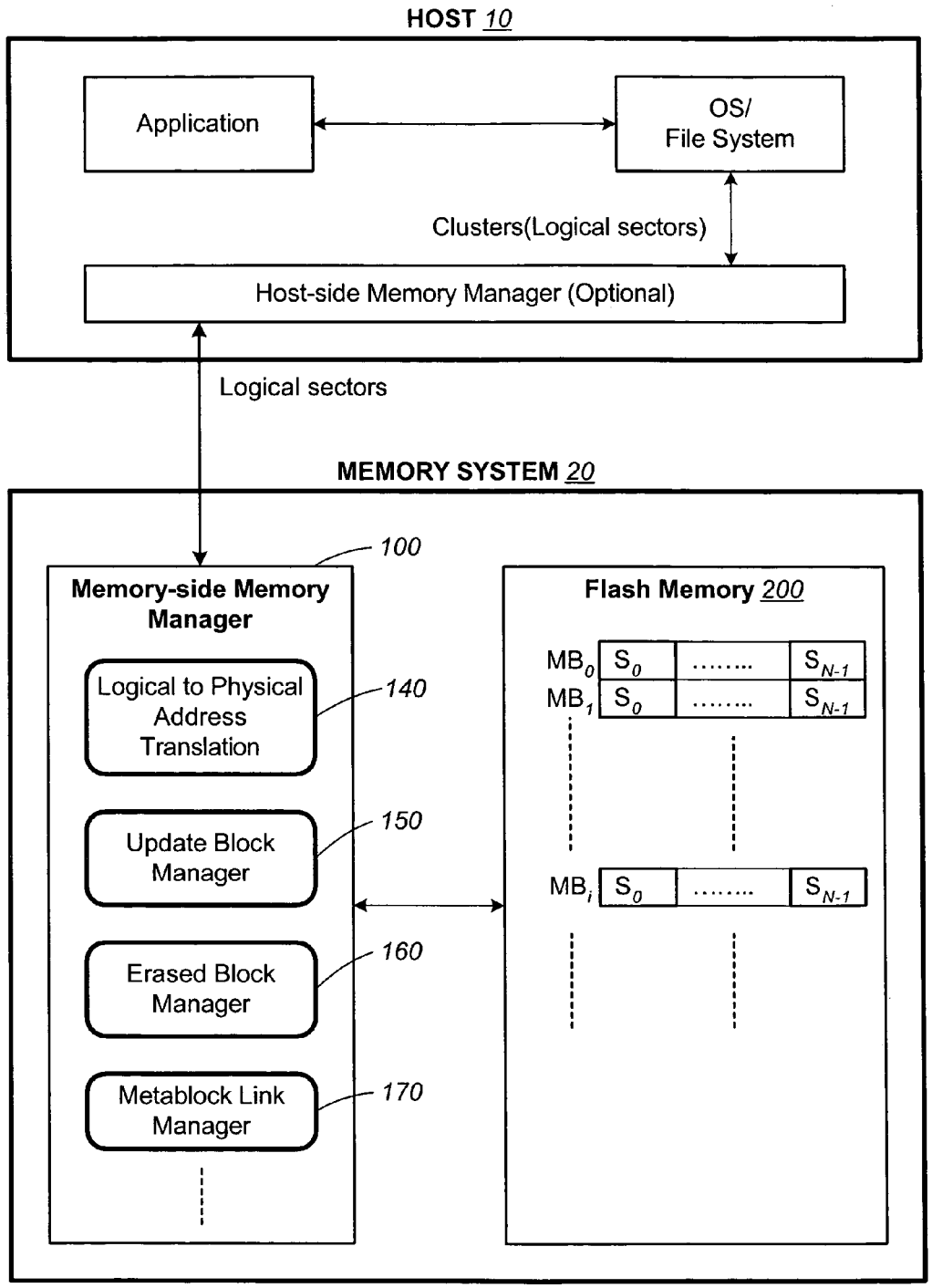
FIG. 2 illustrates the memory being organized into physical groups of sectors (or metablocks) and managed by a memory manager of the controller, according to a preferred embodiment of the invention.

FIG. 2 illustrates the memory being organized into physical groups of sectors (or metablocks) and managed by a memory manager of the controller, according to a preferred embodiment of the invention. The memory 200 is organized into metablocks, where each metablock is a group of physical sectors $S_0, \ldots, S_{N-1}$ that are erasable together.

The host 10 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 10 essentially issues a command to the memory system 20 to read or write a segment containing a string of logical sectors of data with contiguous addresses.

A memory-side memory manager is implemented in the controller 100 of the memory system 20 to manage the storage and retrieval of the data of host logical sectors among metablocks of the flash memory 200. In the preferred embodiment, the memory manager contains a number of software modules for managing erase, read and write operations of the metablocks. The memory manager also maintains system control and directory data associated with its operations among the flash memory 200 and the controller RAM 130.

Figure 3A:
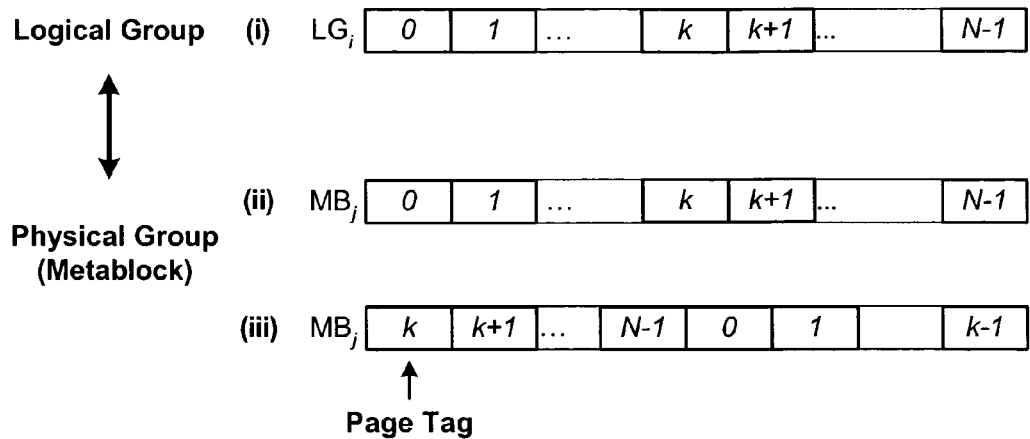
FIGS. 3A(i)–3A(iii) illustrate schematically the mapping between a logical group and a metablock, according to a preferred embodiment of the present invention.

FIGS. 3A(i)–3A(iii) illustrate schematically the mapping between a logical group and a metablock, according to a preferred embodiment of the present invention. The metablock of the physical memory has N physical sectors for storing N logical sectors of data of a logical group. FIG. 3A(i) shows the data from a logical group $LG_i$, where the logical sectors are in contiguous logical order 0, 1, . . . , N−1. FIG. 3A(ii) shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 3A(iii), the metablock stores in its first location beginning with the data of logical sector k. When the last logical sector N−1 is reached, it wraps around to sector 0 and finally storing data associated with logical sector k−1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 3B:
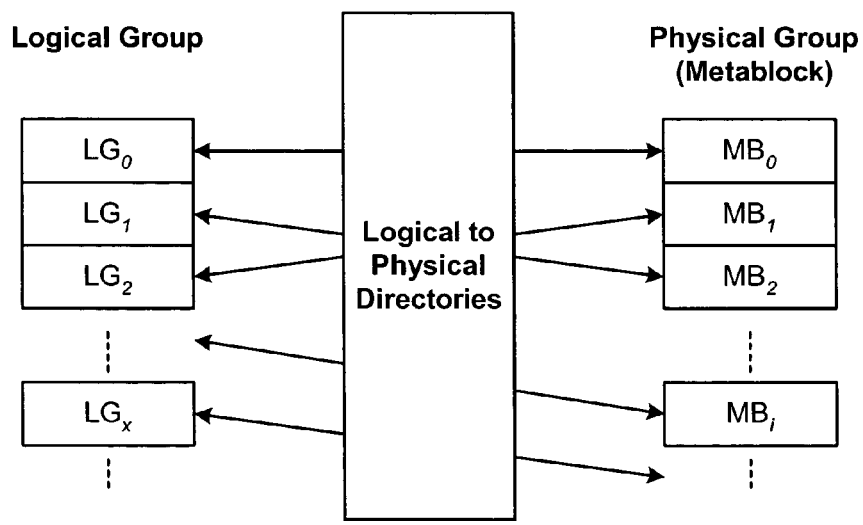
FIG. 3B illustrates schematically the mapping between logical groups and metablocks.

FIG. 3B illustrates schematically the mapping between logical groups and metablocks. Each logical group is mapped to a unique metablock, except for a small number of logical groups in which data is currently being updated. After a logical group has been updated, it may be mapped to a different metablock. The mapping information is maintained in a set of logical to physical directories, which will be described in more detail later.

Other types of logical group to metablock mapping are also contemplated. For example, metablocks with variable size are disclosed in co-pending and co-owned United States Patent application, entitled, "Adaptive Metablocks," filed by Alan Sinclair, on the same day as the present application. The entire disclosure of the co-pending application is hereby incorporated herein by reference.

One feature of the invention is that the system operates with a single logical partition, and groups of logical sectors throughout the logical address range of the memory system are treated identically. For example, sectors containing system data and sectors containing user data can be distributed anywhere among the logical address space.

Unlike prior art systems, there is no special partitioning or zoning of system sectors (i.e., sectors relating to file allocation tables, directories or sub-directories) in order to localize in logical address space sectors that are likely to contain data with high-frequency and small-size updates. Instead, the present scheme of updating logical groups of sectors will efficiently handle the patterns of access that are typical of system sectors, as well as those typical of file data.

Figure 4:
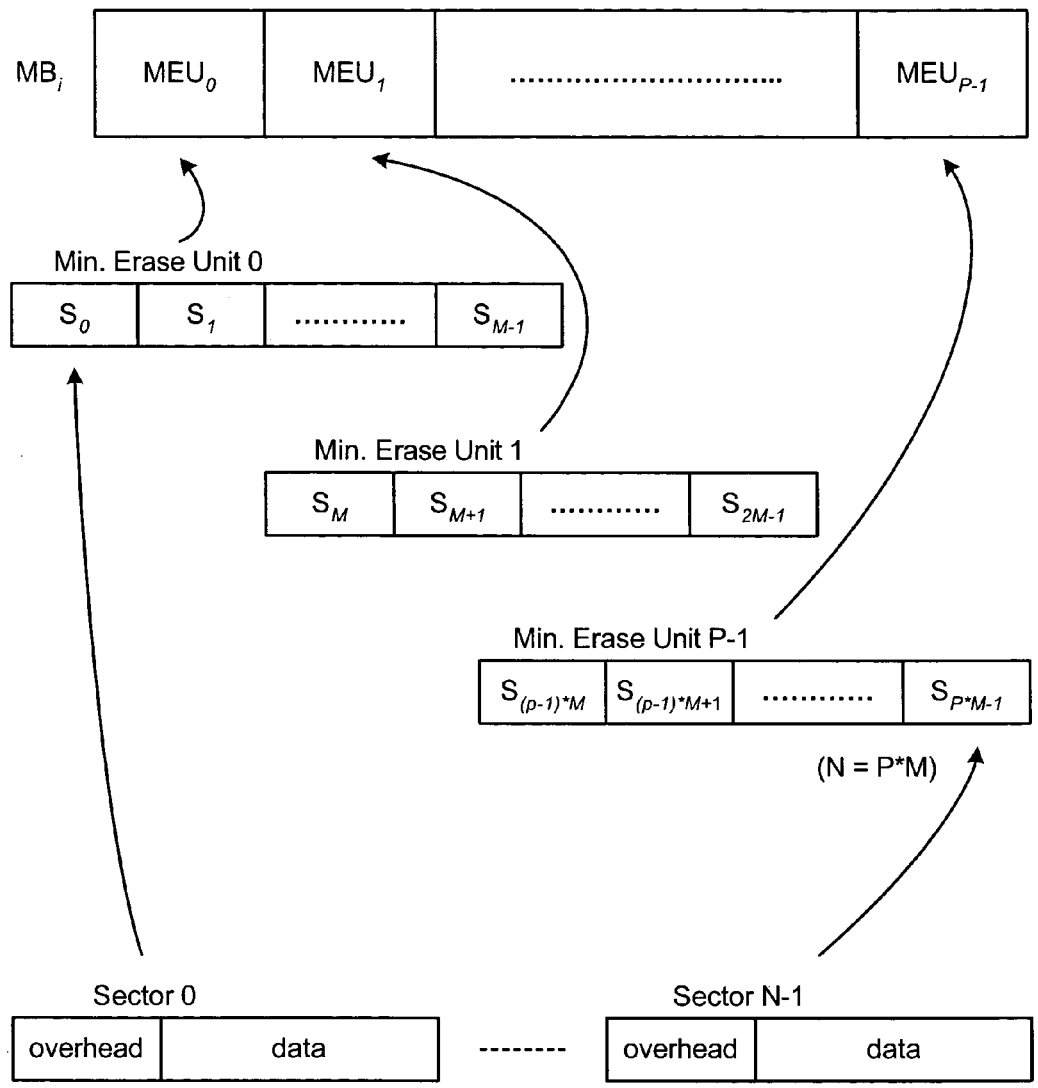
FIG. 4 illustrates the alignment of a metablock with structures in physical memory.

FIG. 4 illustrates the alignment of a metablock with structures in physical memory. Flash memory comprises blocks of memory cells which are erasable together as a unit. Such erase blocks are the minimum unit of erasure of flash memory or minimum erasable unit (MEU) of the memory. The minimum erase unit is a hardware design parameter of the memory, although in some memory systems that supports multiple MEUs erase, it is possible to configure a "super MEU" comprising more than one MEU. For flash EEPROM, a MEU may comprise one sector but preferably multiple sectors. In the example shown, it has M sectors. In the preferred embodiment, each sector can store 512 bytes of data and has a user data portion and a header portion for storing system or overhead data. If the metablock is constituted from P MEUs, and each MEU contains M sectors, then, each metablock will have N=P*M sectors.

The metablock represents, at the system level, a group of memory locations, e.g., sectors that are erasable together. The physical address space of the flash memory is treated as a set of metablocks, with a metablock being the minimum unit of erasure. Within this specification, the terms "metablock" and "block" are used synonymously to define the minimum unit of erasure at the system level for media management, and the term "minimum erase unit" or MEU is used to denote the minimum unit of erasure of flash memory.

Linking of Minimum Erase Units (MEUs) to Form a Metablock

In order to maximize programming speed and erase speed, parallelism is exploited as much as possible by arranging for multiple pages of information, located in multiple MEUs, to be programmed in parallel, and for multiple MEUs to be erased in parallel.

In flash memory, a page is a grouping of memory cells that may be programmed together in a single operation. A page may comprise one or more sector. Also, a memory array may be partitioned into more than one plane, where only one MEU within a plane may be programmed or erased at a time. Finally, the planes may be distributed among one or more memory chips.

In flash memory, the MEUs may comprise one or more page. MEUs within a flash memory chip may be organized in planes. Since one MEU from each plane may be programmed or erased concurrently, it is expedient to form a multiple MEU metablock by selecting one MEU from each plane (see FIG. 5B below.)

Figure 5A:
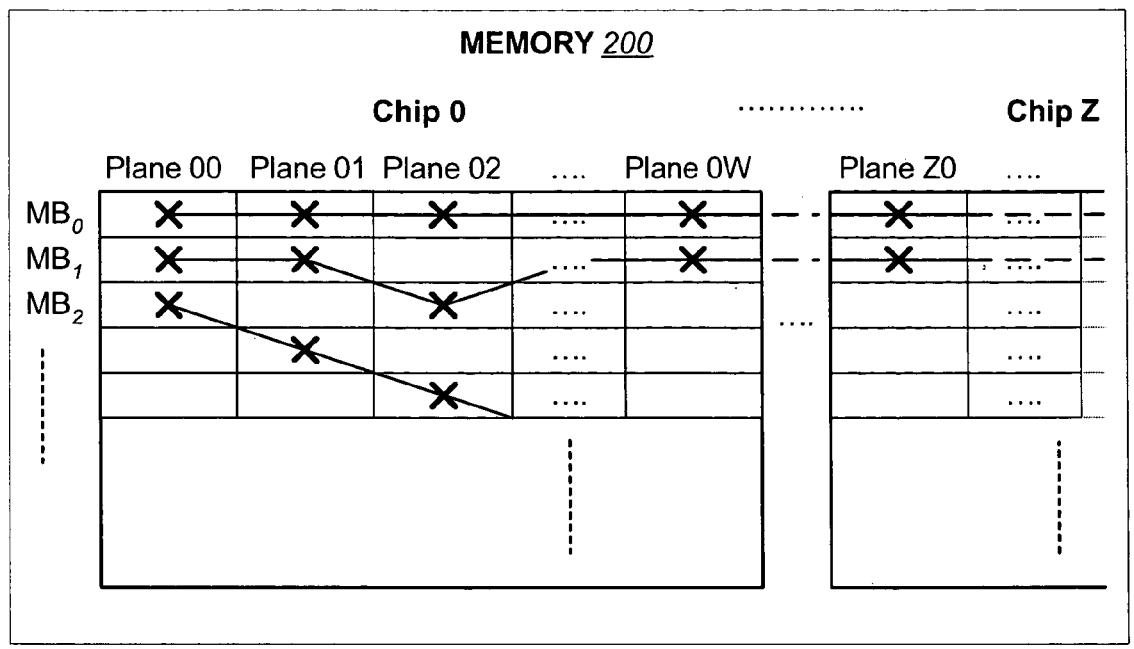
FIG. 5A illustrates metablocks being constituted from linking of minimum erase units of different planes.

FIG. 5A illustrates metablocks being constituted from linking of minimum erase units of different planes. Each metablock, such as MB0, MB1, . . . , is constituted from MEUs from different planes of the memory system, where the different planes may be distributed among one or more chips. The metablock link manager 170 shown in FIG. 2 manages the linking of the MEUs for each metablock. Each metablock is configured during an initial formatting process, and retains its constituent MEUs throughout the life of the system, unless there is a failure of one of the MEUs.

Figure 5B:
FIG. 5B illustrates one embodiment in which one minimum erase unit (MEU) is selected from each plane for linking into a metablock.

FIG. 5B illustrates one embodiment in which one minimum erase unit (MEU) is selected from each plane for linking into a metablock.

Figure 5C:
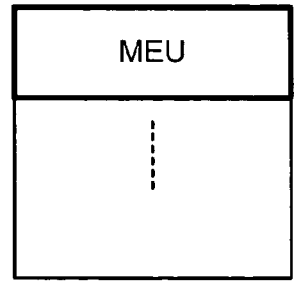
FIG. 5C illustrates another embodiment in which more than one MEU are selected from each plane for linking into a metablock.

FIG. 5C illustrates another embodiment in which more than one MEU are selected from each plane for linking into a metablock. In another embodiment, more than one MEU may be selected from each plane to form a super MEU. For example, a super MEU may be formed from two MEUs. In this case, it may take more than one pass for read or write operation.

The linking and re-linking of MEUs into metablocks is also disclosed in co-pending and co-owned U.S. patent application, entitled "Adaptive Deterministic Grouping of Blocks into Multi-Block Structures," filed by Carlos Gonzales et al, on the same day as the present application. The entire disclosure of the co-pending application is hereby incorporated herein by reference.

Metablock Management

Figure 6:
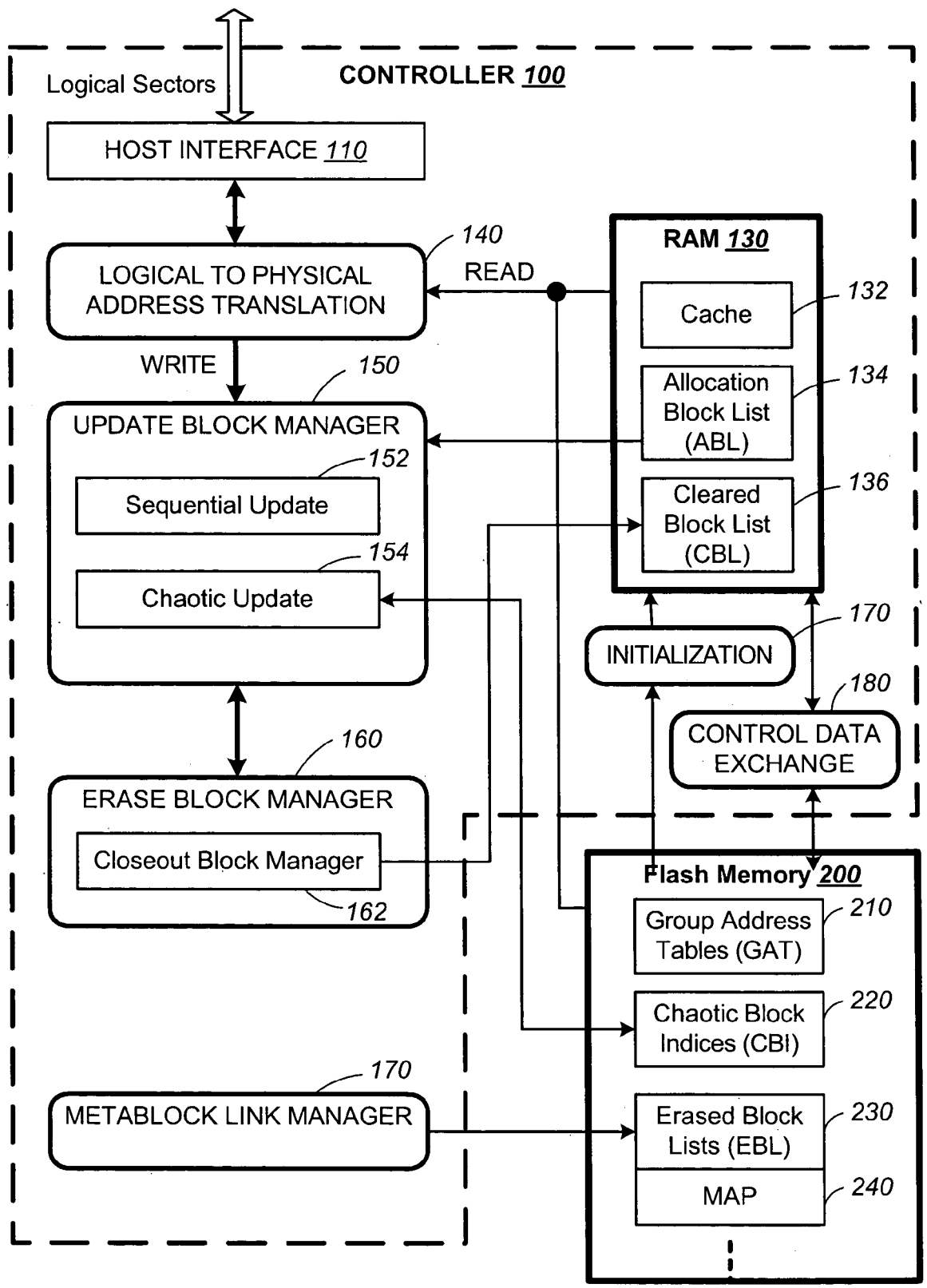
FIG. 6 is a schematic block diagram of the metablock management system as implemented in the controller and flash memory.

FIG. 6 is a schematic block diagram of the metablock management system as implemented in the controller and flash memory. The metablock management system comprises various functional modules implemented in the controller 100 and maintains various control data (including directory data) in tables and lists hierarchically distributed in the flash memory 200 and the controller RAM 130. The function modules implemented in the controller 100 includes an interface module 110, a logical-to-physical address translation module 140, an update block manager module 150, an erase block manager module 160 and a metablock link manager 170.

The interface 110 allows the metablock management system to interface with a host system. The logical to physical address translation module 140 maps the logical address from the host to a physical memory location. The update block Manager module 150 manages data update operations in memory for a given logical group of data. The erased block manager 160 manages the erase operation of the metablocks and their allocation for storage of new information. A metablock link manager 170 manages the linking of subgroups of minimum erasable blocks of sectors to constitute a given metablock. Detailed description of these modules will be given in their respective sections.

During operation the metablock management system generates and works with control data such as addresses, control and status information. Since much of the control data tends to be frequently changing data of small size, it can not be readily stored and maintained efficiently in a flash memory with a large block structure. A hierarchical and distributed scheme is employed to store the more static control data in the nonvolatile flash memory while locating the smaller amount of the more varying control data in controller RAM for more efficient update and access. In the event of a power shutdown or failure, the scheme allows the control data in the volatile controller RAM to be rebuilt quickly by scanning a small set of control data in the nonvolatile memory. This is possible because the invention restricts the number of blocks associated with the possible activity of a given logical group of data. In this way, the scanning is confined. In addition, some of the control data that requires persistence are stored in a nonvolatile metablock that can be updated sector-by-sector, with each update resulting in a new sector being recorded that supercedes a previous one. A sector indexing scheme is employed for control data to keep track of the sector-by-sector updates in a metablock.

The non-volatile flash memory 200 stores the bulk of control data that are relatively static. This includes group address tables (GAT) 210, chaotic block indices (CBI) 220, erased block lists (EBL) 230 and MAP 240. The GAT 210 keeps track of the mapping between logical groups of sectors and their corresponding metablocks. The mappings do not change except for those undergoing updates. The CBI 220 keeps track of the mapping of logically non-sequential sectors during an update. The EBL 230 keeps track of the pool of metablocks that have been erased. MAP 240 is a bitmap showing the erase status of all metablocks in the flash memory.

The volatile controller RAM 130 stores a small portion of control data that are frequently changing and accessed. This includes an allocation block list (ABL) 134 and a cleared block list (CBL) 136. The ABL 134 keeps track of the allocation of metablocks for recording update data while the CBL 136 keeps track of metablocks that have been deallocated and erased. In the preferred embodiment, the RAM 130 acts as a cache for control data stored in flash memory 200.

Update Block Manager

The update block manager 150 (shown in FIG. 2) handles the update of logical groups. According to one aspect of the invention, each logical group of sectors undergoing an update is allocated a dedicated update metablock for recording the update data. In the preferred embodiment, any segment of one or more sectors of the logical group will be recorded in the update block. An update block can be managed to receive updated data in either sequential order or non-sequential (also known as chaotic) order. A chaotic update block allows sector data to be updated in any order within a logical group, and with any repetition of individual sectors. In particular, a sequential update block can become a chaotic update block, without need for relocation of any data sectors. No predetermined allocation of blocks for chaotic data update is required; a non-sequential write at any logical address is automatically accommodated. Thus, unlike prior art systems, there is no special treatment whether the various update segments of the logical group is in logical sequential or non-sequential order. The generic update block will simply be used to record the various segments in the order they are requested by the host. For example, even if host system data or system control data tends to be updated in chaotic fashion, regions of logical address space corresponding to host system data do not need to be treated differently from regions with host user data.

Data of a complete logical group of sectors is preferably stored in logically sequential order in a single metablock. In this way, the index to the stored logical sectors is predefined. When the metablock has in store all the sectors of a given logical group in a predefined order it is said to be "intact." As for an update block, when it eventually fills up with update data in logically sequential order, then the update block will become an updated intact metablock that readily replace the original metablock. On the other hand, if the update block fills up with update data in a logically different order from that of the intact block, the update block is a non-sequential or chaotic update block and the out of order segments must be further processed so that eventually the update data of the logical group is stored in the same order as that of the intact block. In the preferred case, it is in logically sequential order in a single metablock. The further processing involves consolidating the updated sectors in the update block with unchanged sectors in the original block into yet another update metablock. The consolidated update block will then be in logically sequential order and can be used to replace the original block. Under some predetermined condition, the consolidation process is preceded by one or more compaction processes. The compaction process simply re-records the sectors of the chaotic update block into a replacing chaotic update block while eliminating any duplicate logical sector that has been rendered obsolete by a subsequent update of the same logical sector.

The update scheme allows for multiple update threads running concurrently, up to a predefined maximum. Each thread is a logical group undergoing updates using its dedicated update metablock.

Sequential Data Update

When data belonging to a logical group is first updated, a metablock is allocated and dedicated as an update block for the update data of the logical group. The update block is allocated when a command is received from the host to write a segment of one or more sectors of the logical group for which an existing metablock has been storing all its sectors intact. For the first host write operation, a first segment of data is recorded on the update block. Since each host write is a segment of one or more sector with contiguous logical address, it follows that the first update is always sequential in nature. In subsequent host writes, update segments within the same logical group are recorded in the update block in the order received from the host. A block continues to be managed as a sequential update block whilst sectors updated by the host within the associated logical group remain logically sequential. All sectors updated in this logical group are written to this sequential update block, until the block is either closed or converted to a chaotic update block.

Figure 7A:
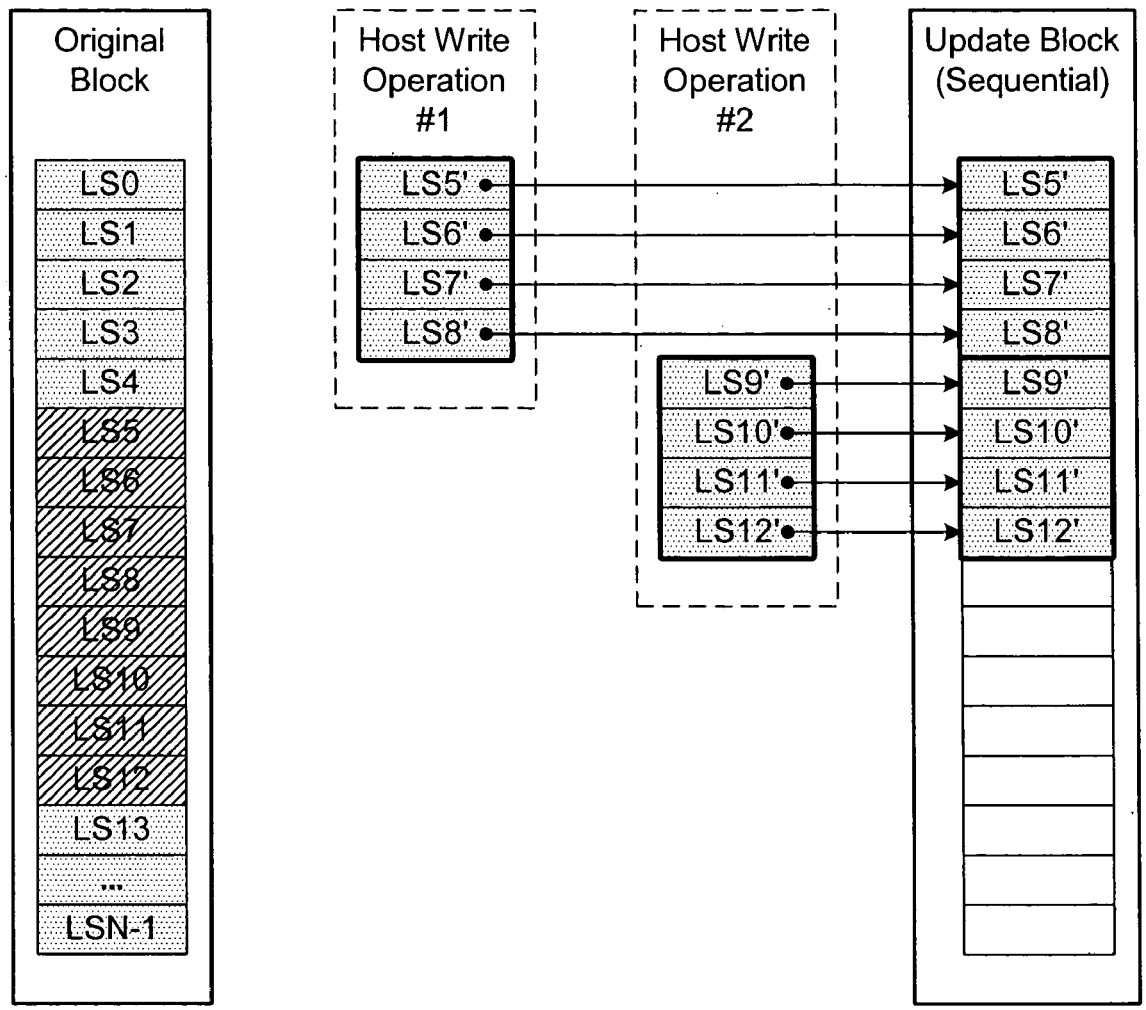
FIG. 7A illustrates an example of sectors in a logical group being written in sequential order to a sequential update block.

FIG. 7A illustrates an example of sectors in a logical group being written in sequential order to a sequential update block as a result of two separate host write operations, whilst the corresponding sectors in the original block for the logical group become obsolete. In host write operation #1, the data in the logical sectors LS5–LS8 are being updated. The updated data as LS5'–LS8' are recorded in a newly allocated dedicated update block.

For expediency, the first sector to be updated in the logical group is recorded in the dedicated update block starting from the first physical sector location. In general, the first logical sector to be updated is not necessarily the logical first sector of the group, and there may therefore be an offset between the start of the logical group and the start of the update block. This offset is known as page tag as described previously in connection with FIG. 3A. Subsequent sectors are updated in logically sequential order. When the last sector of the logical group is written, group addresses wrap around and the write sequence continues with the first sector of the group.

In host write operation #2, the segment of data in the logical sectors LS9–LS12 are being updated. The updated data as LS9'–LS12' are recorded in the dedicated update block in a location directly following where the last write ends. It can be seen that the two host writes are such that the update data has been recorded in the update block in logically sequential order, namely LS5'–LS12'. The update block is regarded as a sequential update block since it has been filled in logically sequential order. The update data recorded in the update block obsoletes the corresponding ones in the original block.

Chaotic Data Update

Chaotic update block management may be initiated for an existing sequential update block when any sector updated by the host within the associated logical group is logically non-sequential. A chaotic update block is a form of data update block in which logical sectors within an associated logical group may be updated in any order and with any amount of repetition. It is created by conversion from a sequential update block when a sector written by a host is logically non-sequential to the previously written sector within the logical group being updated. All sectors subsequently updated in this logical group are written in the next available sector location in the chaotic update block, whatever their logical sector address within the group.

Figure 7B:
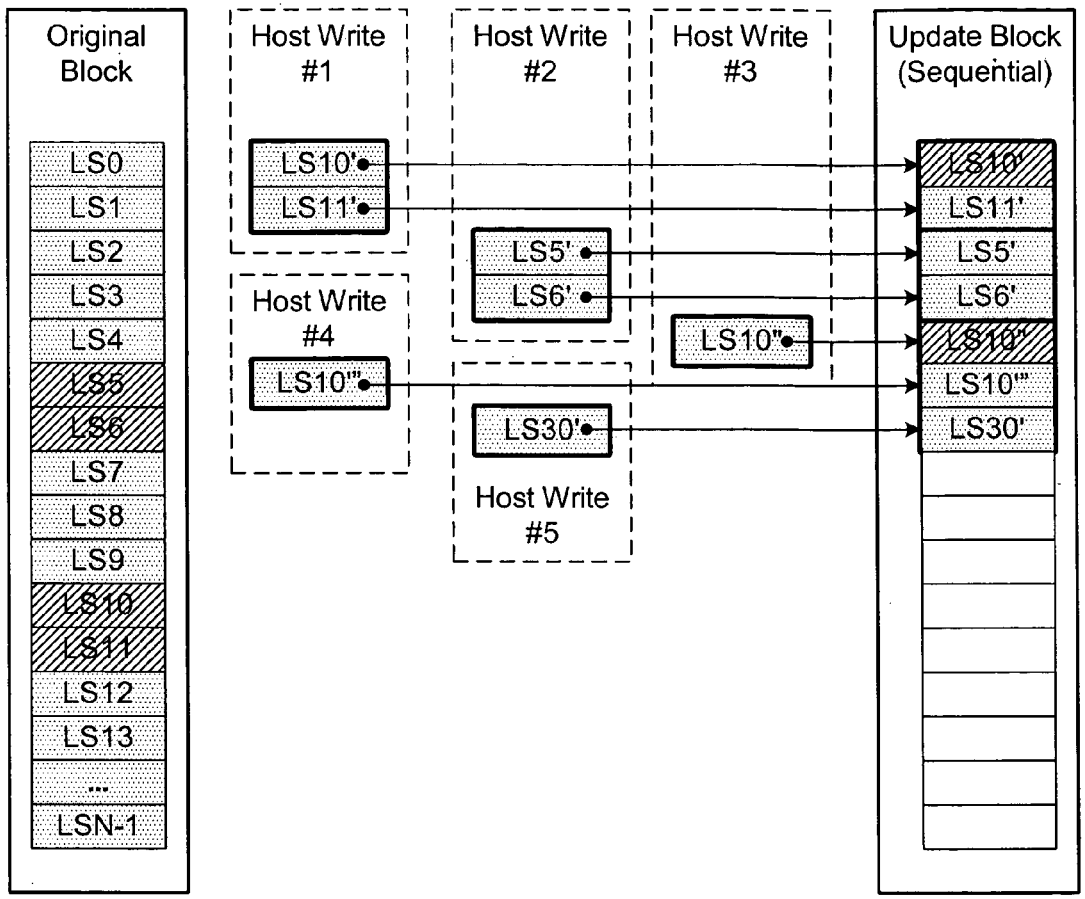
FIG. 7B illustrates an example of sectors in a logical group being written in chaotic order to a chaotic update block.

FIG. 7B illustrates an example of sectors in a logical group being written in chaotic order to a chaotic update block as a result of five separate host write operations, whilst superseded sectors in the original block for the logical group and duplicated sectors in the chaotic update block become obsolete. In host write operation #1, the logical sectors LS10–LS11 of a given logical group stored in an original metablock is updated. The updated logical sectors LS10'–LS11' are stored in a newly allocated update block. At this point, the update block is a sequential one. In host write operation #2, the logical sectors LS5–LS6 are updated as LS5'–LS6' and recorded in the update block in the location immediately following the last write. This converts the update block from a sequential to a chaotic one. In host write operation #3, the logical sector LS10 is being updated again and is recorded in the next location of the update block as LS10". At this point LS10" in the update block supersedes LS10' in a previous recording which in turns supercedes LS10 in the original block. In host write operation #4, the data in the logical sector LS10 is again updated and is recorded in the next location of the update block as LS10'''. Thus, LS10''' is now the latest and only valid data for the logical sector LS10. In host write operation #5, the data in logical sector LS30 is being updated and recorded in the update block as LS30'. Thus, the example illustrates that sectors within a logical group can be written in a chaotic update block in any order and with any repetition.

Forced Sequential Update

Figure 8:
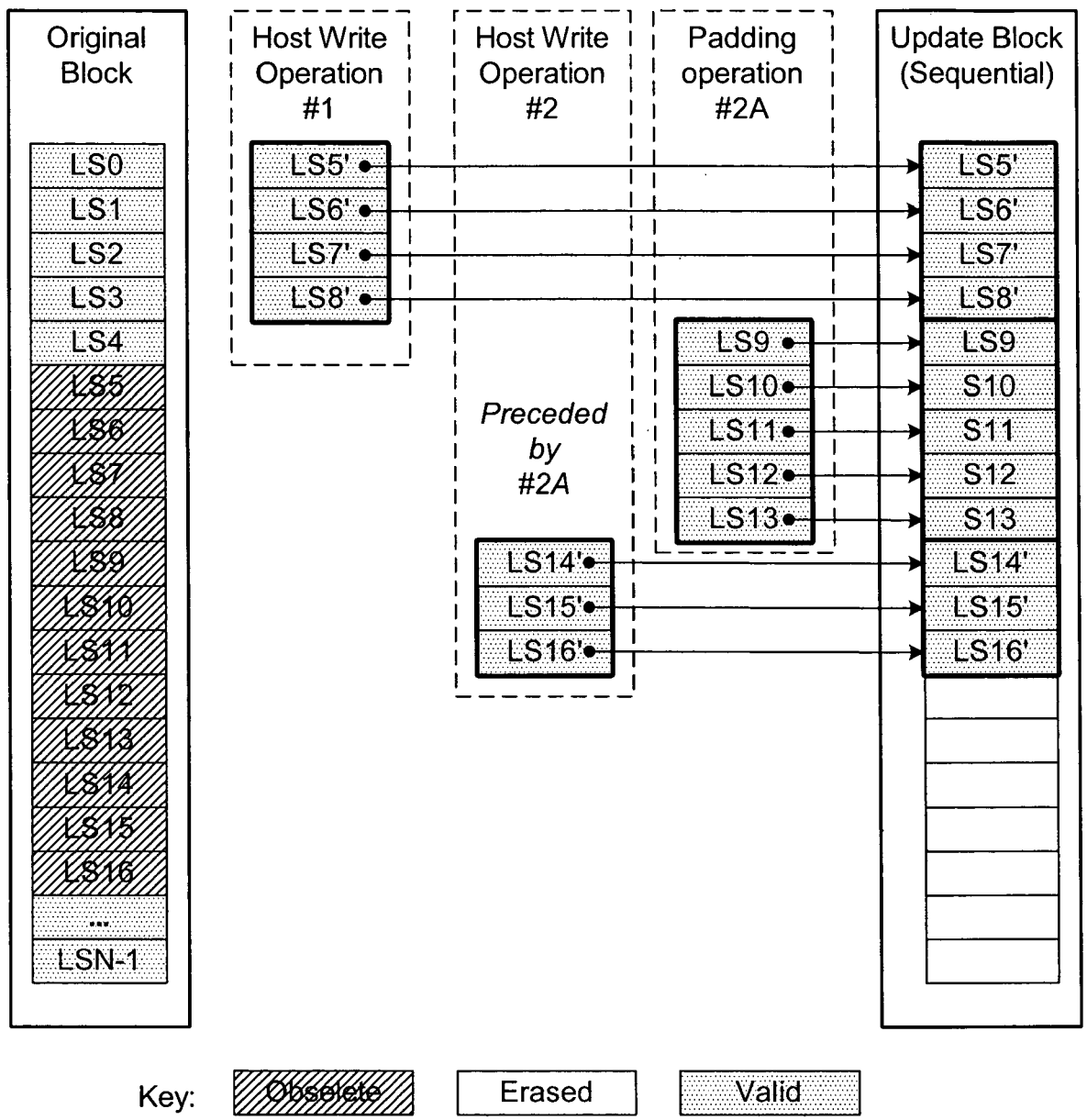
FIG. 8 illustrates an example of sectors in a logical group being written in sequential order to a sequential update block as a result of two separate host write operations that has a discontinuity in logical addresses.

FIG. 8 illustrates an example of sectors in a logical group being written in sequential order to a sequential update block as a result of two separate host write operations that has a discontinuity in logical addresses. In host write #1, the update data in the logical sectors LS5–LS8 is recorded in a dedicated update block as LS5'–LS8'. In host write #2, the update data in the logical sectors LS14–LS16 is being recorded in the update block following the last write as LS14'–LS16'. However, there is an address jump between LS8 and LS14 and the host write #2 would normally render the update block non-sequential. Since the address jump is not substantial, one option is to first perform a padding operation (#2A) by copying the data of the intervening sectors from the original block to the update block before executing host write #2. In this way, the sequential nature of the update block is preserved.

Figure 9:
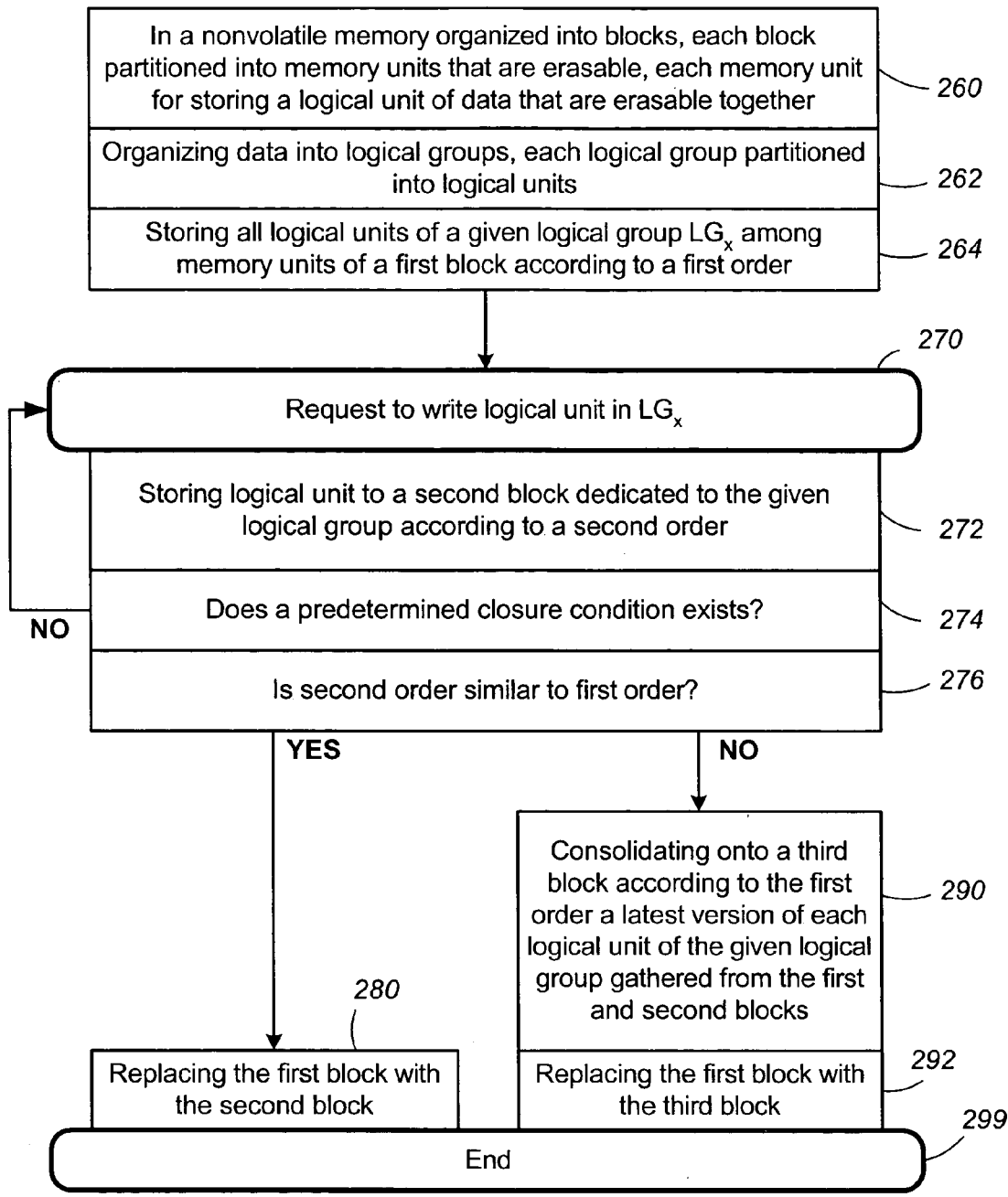
FIG. 9 is a flow diagram illustrating a process by the update block manager to update a logical group of data, according a general embodiment of the invention.

FIG. 9 is a flow diagram illustrating a process by the update block manager to update a logical group of data, according a general embodiment of the invention. The update process comprises the following steps:

STEP 260: The memory is organized into blocks, each block partitioned into memory units that are erasable together, each memory unit for storing a logical unit of data.

STEP 262: The data is organized into logical groups, each logical group partitioned into logical units.

STEP 264: In the standard case, all logical units of a logical group is stored among the memory units of an original block according to a first prescribed order, preferably, in logically sequential order. In this way, the index for accessing the individual logical units in the block is known.

STEP 270: For a given logical group (e.g., $LG_X$) of data, a request is made to update a logical unit within $LG_X$. (A logical unit update is given as an example. In general the update will be a segment of one or more contiguous logical units within $LG_X$.)

STEP 272: The requested update logical unit is to be stored in a second block, dedicated to recording the updates of $LG_X$. The recording order is according to a second order, typically, the order the updates are requested. One feature of the invention allows an update block to be set up initially generic to recording data in logically sequential or chaotic order. So depending on the second order, the second block can be a sequential one or a chaotic one.

STEP 274: The second block continues to have requested logical units recorded as the process loops back to STEP 270. The second block will be closed to receiving further update when a predetermined condition for closure materializes. In that case, the process proceeds to STEP 276.

STEP 276: Determination is made whether or not the closed, second block has its update logical units recorded in a similar order as that of the original block. The two blocks are considered to have similar order when they recorded logical units differ by only a page tag, as described in connection with FIG. 3A. If the two blocks have similar order the process proceeds to STEP 280, otherwise, some sort of garbage collection need to be performed in STEP 290.

STEP 280: Since the second block has the same order as the first block, it is used to replace the original, first block. The update process then ends at STEP 299.

STEP 290: The latest version of each logical units of the given logical group are gathered from among the second block (update block) and the first block (original block). The consolidated logical units of the given logical group are then written to a third block in an order similar to the first block.

STEP 292: Since the third block (consolidated block) has a similar order to the first block, it is used to replace the original, first block. The update process then ends at STEP 299.

STEP 299: When a closeout process creates an intact update block, it becomes the new standard block for the given logical group. The update thread for the logical group will be terminated.

Figure 10:
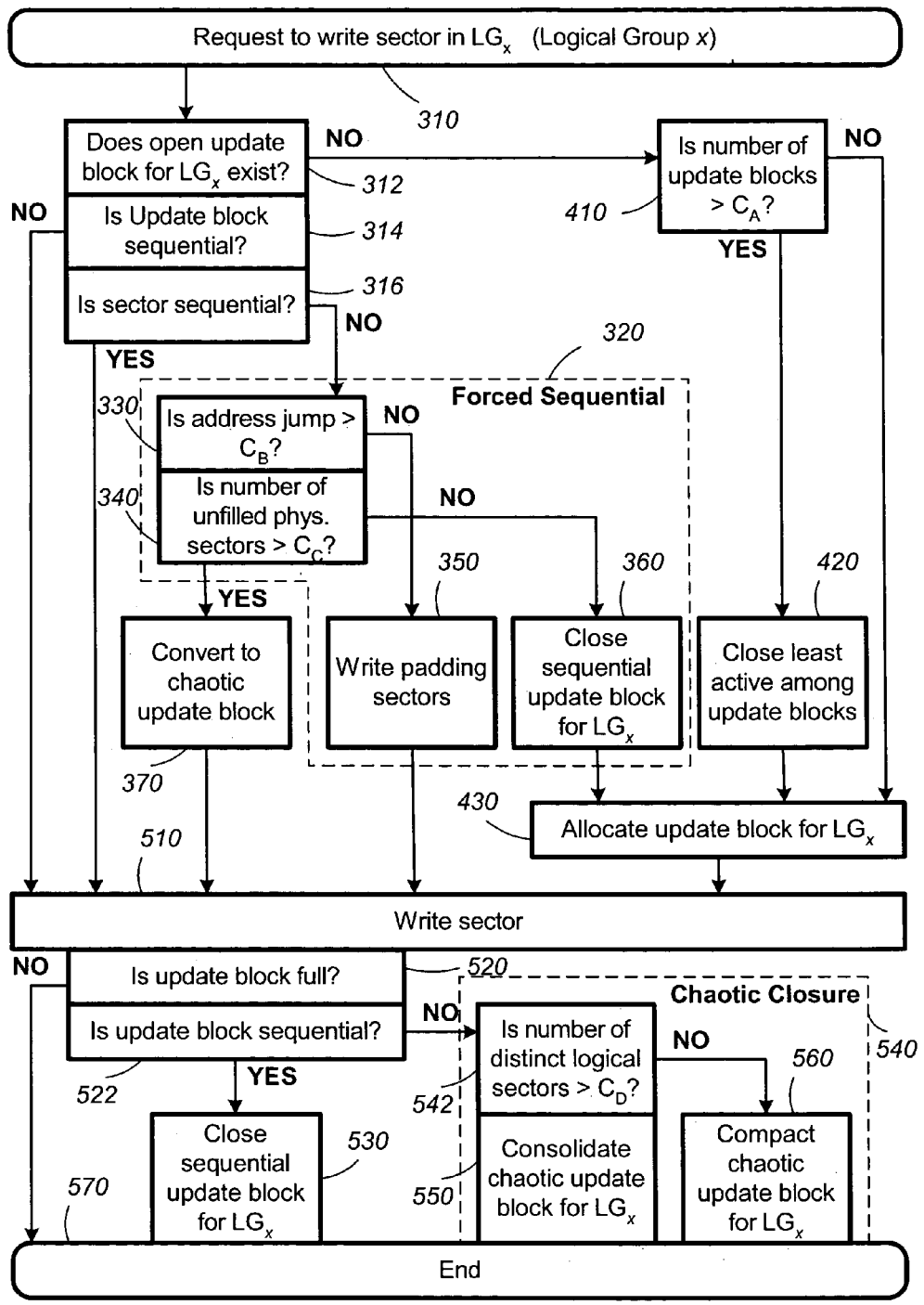
FIG. 10 is a flow diagram illustrating a process by the update block manager to update a logical group of data, according a preferred embodiment of the invention.

FIG. 10 is a flow diagram illustrating a process by the update block manager to update a logical group of data, according a preferred embodiment of the invention. The update process comprises the following steps:

STEP 310: For a given logical group (e.g., $LG_X$) of data, a request is made to update a logical sector within $LG_X$. (A sector update is given as an example. In general the update will be a segment of one or more contiguous logical sectors within $LG_X$.)

STEP 312: If an update block dedicated to $LG_X$ does not already exist, proceed to STEP 410 to initiate a new update thread for the logical group. This will be accomplished by allocating an update block dedicated to recording update data of the logical group. If there is already an update block open, proceed to STEP 314 to begin recording the update sector onto the update block.

STEP 314: If the current update block is already chaotic (i.e., non-sequential) then simply proceed to STEP 510 for recording the requested update sector onto the chaotic update block. If the current update block is sequential, proceed to STEP 316 for processing of a sequential update block.

STEP 316: One feature of the invention allows an update block to be set up initially generic to recording data in logically sequential or chaotic order. However, since the logical group ultimately has its data stored in a metablock in a logically sequential order, it is desirable to keep the update block sequential as far as possible. Less processing will then be required when an update block is closed to further updates as garbage collection will not be needed.

Thus determination is made whether the requested update will follow the current sequential order of the update block. If the update follows sequentially, then proceed to STEP 510 to perform a sequential update, and the update block will remain sequential. On the other hand, if the update does not follow sequentially (chaotic update), it will convert the sequential update block to a chaotic one if no other actions are taken.

In one embodiment, nothing more is done to salvage the situation and the process proceeds directly to STEP 370 where the update is allowed to turn the update block into a chaotic one.

Optional Forced Sequential Process

In another embodiment, a forced sequential process STEP 320 is optionally performed to preserve the sequential update block as far as possible in view of a pending chaotic update. There are two situations, both of which require copying missing sectors from the original block to maintain the sequential order of logical sectors recorded on the update block. The first situation is where the update creates a short address jump. The second situation is to prematurely close out an update block in order to keep it sequential. The forced sequential process STEP 320 comprises the following sub-steps:

STEP 330: If the update creates a logical address jump not greater a predetermined amount, $C_B$, the process proceeds to a forced sequential update process in STEP 350, otherwise the process proceeds to STEP 340 to consider if it qualifies for a forced sequential closeout.

STEP 340: If the number of unfilled physical sectors exceeds a predetermined design parameter, $C_C$, whose typical value is half of the size of the update block, then the update block is relatively unused and will not be prematurely closed. The process proceeds to STEP 370 and the update block will become chaotic. On the other hand, if the update block is substantially filled, it is considered to have been well utilized already and therefore is directed to STEP 360 for forced sequential closeout.

STEP 350: Forced sequential update allows current sequential update block to remain sequential as long as the address jump does not exceed a predetermined amount, $C_B$. Essentially, sectors from the update block's associated original block are copied to fill the gap spanned by the address jump. Thus, the sequential update block will be padded with data in the intervening addresses before proceeding to STEP 510 to record the current update sequentially.

STEP 360: Forced sequential closeout allows the currently sequential update block to be closed out if it is already substantially filled rather than converted to a chaotic one by the pending chaotic update. A chaotic or non-sequential update is defined as one with a forward address transition not covered by the address jump exception described above, a backward address transition, or an address repetition. To prevent a sequential update block to be converted by a chaotic update, the unwritten sector locations of the update block are filled by copying sectors from the update block's associated original partly-obsolete block. The original block is then fully obsolete and may be erased. The current update block now has the full set of logical sectors and is then closed out as an intact metablock replacing the original metablock. The process then proceeds to STEP 430 to have a new update block allocated in its place to accept the recording of the pending sector update that was first requested in STEP 310.

Conversion to Chaotic Update Block

STEP 370: When the pending update is not in sequential order and optionally, if the forced sequential conditions are not satisfied, the sequential update block is allowed to be converted to a chaotic one by virtue of allowing the pending update sector, with non-sequential address, to be recorded on the update block when the process proceeds to STEP 510. If the maximum number of chaotic update blocks exist, it is necessary to close the least recently accessed chaotic update block before allowing the conversion to proceed; thus preventing the maximum number of chaotic blocks from being exceeded. The identification of the least recently accessed chaotic update block is the same as the general case described in STEP 420, but is constrained to chaotic update blocks only. Closing a chaotic update block at this time is achieved by consolidation as described in STEP 550.

Allocation of New Update Block Subject to System Restriction

STEP 410: The process of allocating an erase metablock as an update block begins with the determination whether a predetermined system limitation is exceeded or not. Due to finite resources, the memory management system typically allows a predetermined maximum number of update blocks, $C_A$, to exist concurrently. This limit is the aggregate of sequential update blocks and chaotic update blocks, and is a design parameter. In a preferred embodiment, the limit is, for example, a maximum of 8 update blocks. Also, due to the higher demand on system resources, there may also be a corresponding predetermined limit on the maximum number of chaotic update blocks that can be open concurrently (e.g., 4.)

Thus, when $C_A$ update blocks have already been allocated, then the next allocation request could only be satisfied after closing one of the existing allocated ones. The process proceeds to STEP 420. When the number of open update blocks is less than $C_A$, the process proceeds directly to STEP 430.

STEP 420: In the event the maximum number of update blocks, $C_A$, is exceeded, the least-recently accessed update block is closed and garbage collection is performed. The least recently accessed update block is identified as the update block associated with the logical block that has been accessed least recently. For the purpose of determining the least recently accessed blocks, an access includes writes and optionally reads of logical sectors. A list of open update blocks is maintained in order of access; at initialization, no access order is assumed. The closure of an update block follows along the similar process described in connection with STEP 360 and STEP 530 when the update block is sequential, and in connection with STEP 540 when the update block is chaotic. The closure makes room for the allocation of a new update block in STEP 430.

STEP 430: The allocation request is fulfilled with the allocation of a new metablock as an update block dedicated to the given logical group $LG_X$. The process then proceeds to STEP 510.

Record Update Data onto Update Block

STEP 510: The requested update sector is recorded onto next available physical location of the update block. The process then proceeds to STEP 520 to determine if the update block is ripe for closeout.

Update Block Closeout

STEP 520: If the update block still has room for accepting additional updates, proceed to STEP 570. Otherwise proceed to STEP 522 to closeout the update block. There are two possible implementations of filling up an update block when the current requested write attempts to write more logical sectors than the block has room for. In the first implementation, the write request is split into two portions, with the first portion writing up to the last physical sector of the block. The block is then closed and the second portion of the write will be treated as the next requested write. In the other implementation, the requested write is withheld while the block has it remaining sectors padded and is then closed. The requested write will be treated as the next requested write.

STEP 522: If the update block is sequential, proceed to STEP 530 for sequential closure. If the update block is chaotic, proceed to STEP 540 for chaotic closure.

Sequential Update Block Closeout

STEP 530: Since the update block is sequential and fully filled, the logical group stored in it is intact. The metablock is intact and replaces the original one. At this time, the original block is fully obsolete and may be erased. The process then proceeds to STEP 570 where the update thread for the given logical group ends.

Chaotic Update Block Closeout

STEP 540: Since the update block is non-sequentially filled and may contain multiple updates of some logical sectors, garbage collection is performed to salvage the valid data in it. The chaotic update block will either be compacted or consolidated. Which process to perform will be determined in STEP 542.

STEP 542: To perform compaction or consolidation will depend on the degeneracy of the update block. If a logical sector is updated multiple times, its logical address is highly degenerate. There will be multiple versions of the same logical sector recorded on the update block and only the last recorded version is the valid one for that logical sector. In an update block containing logical sectors with multiple versions, the number of distinct logical sectors will be much less than that of a logical group.

In the preferred embodiment, when the number of distinct logical sectors in the update block exceeds a predetermined design parameter, $C_D$, whose typical value is half of the size of a logical group, the closeout process will perform a consolidation in STEP 550, otherwise the process will proceed to compaction in STEP 560.

STEP 550: If the chaotic update block is to be consolidated, the original block and the update block will be replaced by a new standard metablock containing the consolidated data. After consolidation the update thread will end in STEP 570.

STEP 560: If the chaotic update block is to be compacted, it will be replaced by a new update block carrying the compacted data. After compaction the processing of the compacted update block will end in STEP 570. Alternatively, compaction can be delayed until the update block is written to again, thus removing the possibility of compaction being followed by consolidation without intervening updates. The new update block will then be used in further updating of the given logical block when a next request for update in $LG_X$ appears in STEP 502.

STEP 570: When a closeout process creates an intact update block, it becomes the new standard block for the given logical group. The update thread for the logical group will be terminated. When a closeout process creates a new update block replacing an existing one, the new update block will be used to record the next update requested for the given logical group. When an update block is not closed out, the processing will continue when a next request for update in $LG_X$ appears in STEP 310.

As can be seen from the process described above, when a chaotic update block is closed, the update data recorded on it is further processed. In particular its valid data is garbage collected either by a process of compaction to another chaotic block, or by a process of consolidation with its associated original block to form a new standard sequential block.

Figure 11A:
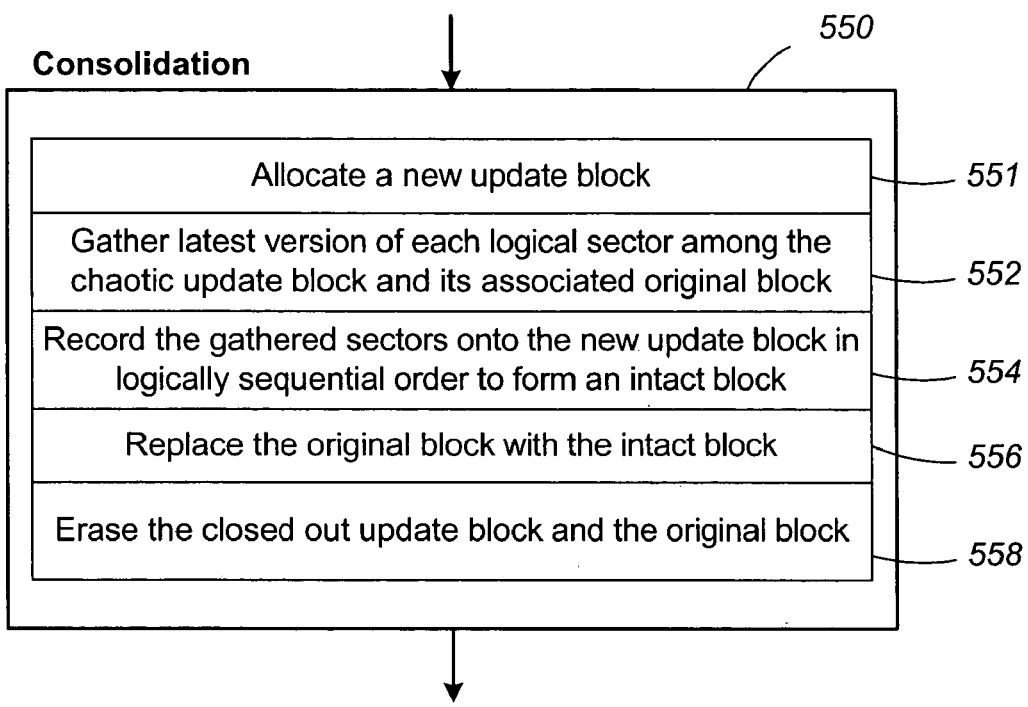
FIG. 11A is a flow diagram illustrating in more detail the consolidation process of closing a chaotic update block shown in FIG. 10.

FIG. 11A is a flow diagram illustrating in more detail the consolidation process of closing a chaotic update block shown in FIG. 10. Chaotic update block consolidation is one of two possible processes performed when the update block is being closed out, e.g., when the update block is full with its last physical sector location written. Consolidation is chosen when the number of distinct logical sectors written in the block exceeds a predetermined design parameter, $C_D$. The consolidation process STEP 550 shown in FIG. 10 comprises the following substeps:

STEP 551: When a chaotic update block is being closed, a new metablock replacing it will be allocated.

STEP 552: Gather the latest version of each logical sector among the chaotic update block and its associated original block, ignoring all the obsolete sectors.

STEP 554: Record the gathered valid sectors onto the new metablock in logically sequential order to form an intact block, i.e., a block with all the logical sectors of a logical group recorded in sequential order.

STEP 556: Replace the original block with the new intact block.

STEP 558: Erase the closed out update block and the original block.

Figure 11B:
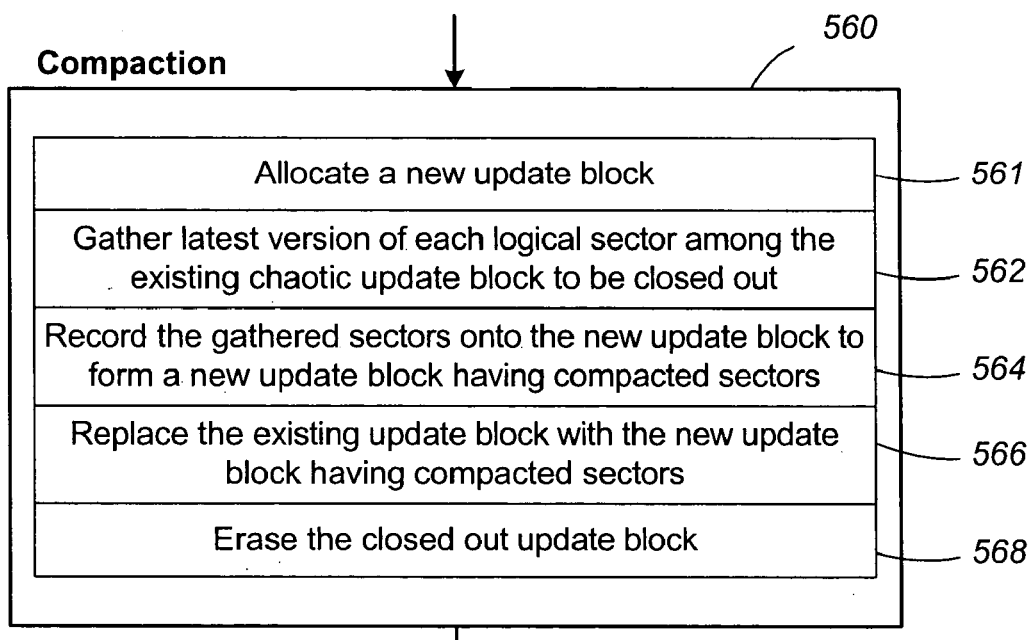
FIG. 11B is a flow diagram illustrating in more detail the compaction process for closing a chaotic update block shown in FIG. 10.

FIG. 11B is a flow diagram illustrating in more detail the compaction process for closing a chaotic update block shown in FIG. 10. Compaction is chosen when the number of distinct logical sectors written in the block is below a predetermined design parameter, $C_D$. The compaction process STEP 560 shown in FIG. 10 comprises the following substeps:

STEP 561: When a chaotic update block is being compacted, a new metablock replacing it will be allocated.

STEP 562: Gather the latest version of each logical sector among the existing chaotic update block to be compacted.

STEP 564: Record the gathered sectors onto the new update block to form a new update block having compacted sectors.

STEP 566: Replace the existing update block with the new update block having compacted sectors.

STEP 568: Erase the closed out update block

Logical and Metablock States

Figure 12A:
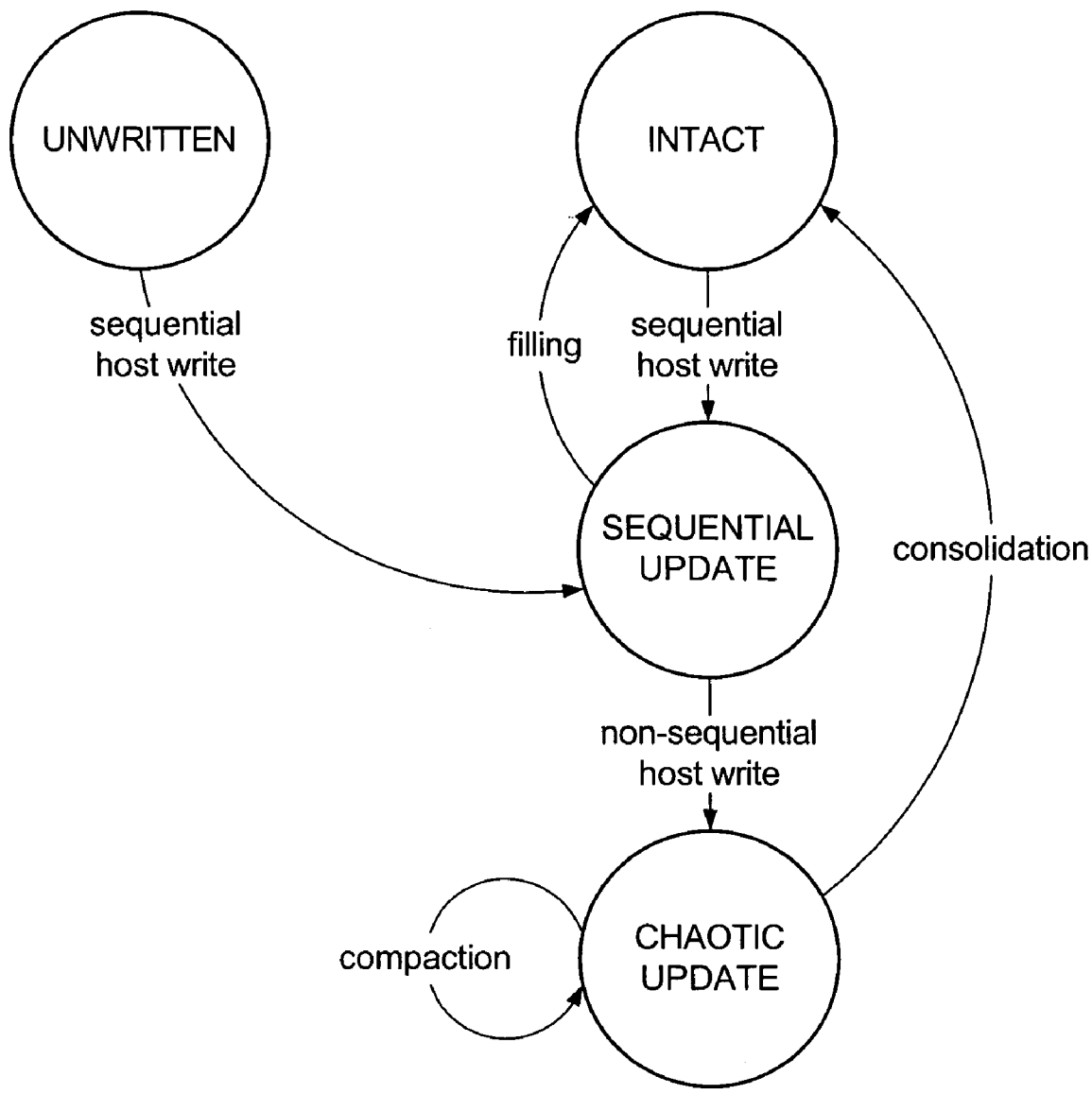
FIG. 12A illustrates all possible states of a Logical Group, and the possible transitions between them under various operations.

FIG. 12A illustrates all possible states of a Logical Group, and the possible transitions between them under various operations.

FIG. 12B is a table listing the possible states of a Logical Group. The Logical Group states are defined as follows:

1. Intact: All logical sectors in the Logical Group have been written in logically sequential order, possibly using page tag wrap around, in a single metablock.
2. Unwritten: No logical sector in the Logical Group has ever been written. The Logical Group is marked as unwritten in a group address table and has no allocated metablock. A predefined data pattern is returned in response to a host read for every sector within this group.
3. Sequential Update: Some sectors within the Logical Group have been written in logically sequential order in a metablock, possibly using page tag, so that they supersede the corresponding logical sectors from any previous Intact state of the group.
4. Chaotic Update: Some sectors within the Logical Group have been written in logically non-sequential order in a metablock, possibly using page tag, so that they supersede the corresponding logical sectors from any previous Intact state of the group. A sector within the group may be written more than once, with the latest version superseding all previous versions.

Figure 13A:
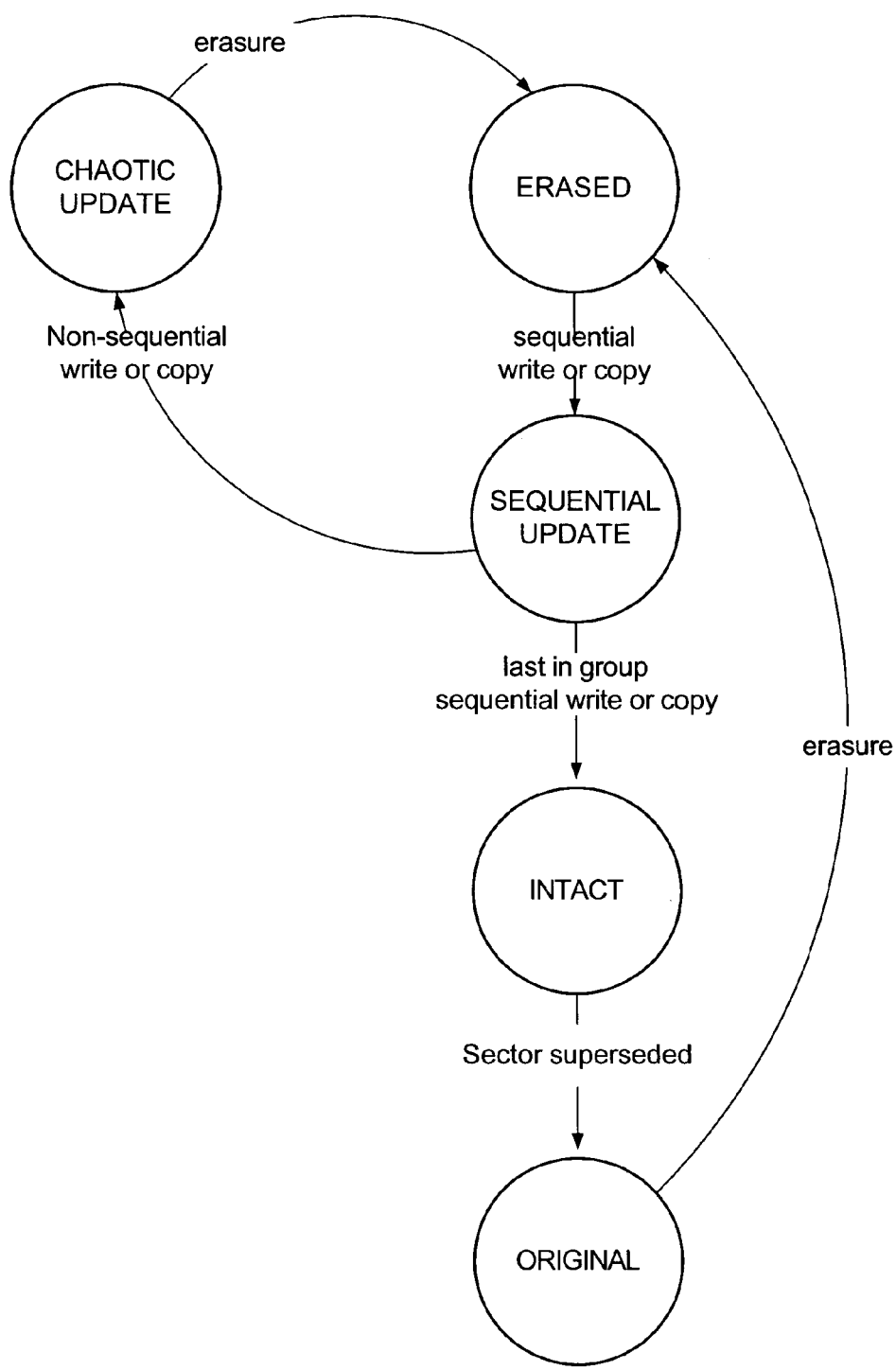
FIG. 13A illustrates all possible states of a metablock, and the possible transitions between them under various operations. A metablock is a Physical Group corresponding to a Logical Group.

FIG. 13A illustrates all possible states of a metablock, and the possible transitions between them under various operations.

FIG. 13B is a table listing the possible states of a metablock. The metablock states are defined as follows:

1. Erased: All the sectors in the metablock are erased.
2. Sequential Update: The metablock is partially written with sectors in logically sequential order, possibly using page tag. All the sectors belong to the same Logical Group.
3. Chaotic Update: The metablock is partially or fully written with sectors in logically non-sequential order. Any sector can be written more than once. All sectors belong to the same Logical Group.
4: Intact: The metablock is fully written in logically sequential order, possibly using page tag.
5: Original: The metablock was previously Intact but at least one sector has been made obsolete by a host data update.

FIGS. 14(A)–14(J) are state diagrams showing the effect of various operations on the state of the logical group and also on the physical metablock.

Figures 14A, 14B:
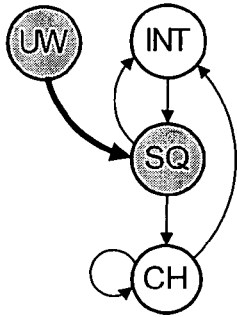

FIG. 14(A) shows state diagrams corresponding to the logical group and the metablock transitions for a first write operation. The host writes one or more sectors of a previously unwritten Logical Group in logically sequential order to a newly allocated Erased metablock. The Logical Group and the metablock go to the Sequential Update state.

FIG. 14(B) shows state diagrams corresponding to the logical group and the metablock transitions for a first intact operation. A previously unwritten Sequential Update Logical Group becomes Intact as all the sectors are written sequentially by the host. The transition can also happen if the card fills up the group by filling the remaining unwritten sectors with a predefined data pattern. The metablock becomes Intact.

Figures 14C, 14D, 14E:
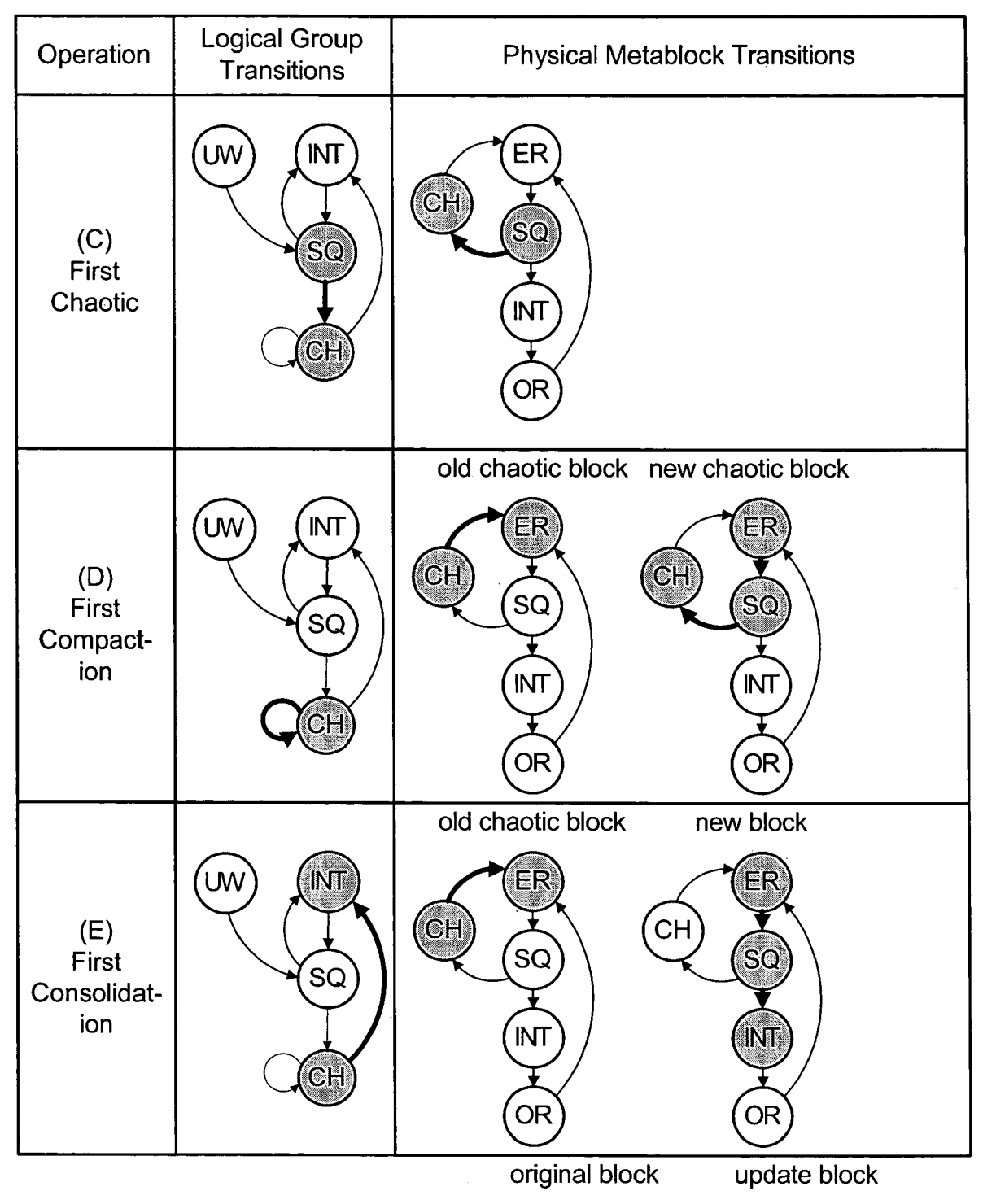

FIG. 14(C) shows state diagrams corresponding to the logical group and the metablock transitions for a first chaotic operation. A previously unwritten Sequential Update Logical Group becomes Chaotic when at least one sector has been written non-sequentially by the host.

FIG. 14(D) shows state diagrams corresponding to the logical group and the metablock transitions for a first compaction operation. All valid sectors within a previously unwritten Chaotic Update Logical Group are copied to a new Chaotic metablock from the old block, which is then erased.

FIG. 14(E) shows state diagrams corresponding to the logical group and the metablock transitions for a first consolidation operation. All valid sectors within a previously unwritten Chaotic Update Logical Group are moved from the old Chaotic block to fill a newly allocated Erased block in logically sequential order. Sectors unwritten by the host are filled with a predefined data pattern. The old chaotic block is then erased.

Figures 14F, 14G, 14H:
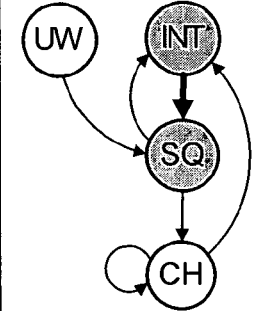

FIG. 14(F) shows state diagrams corresponding to the logical group and the metablock transitions for a sequential write operation. The host writes one or more sectors of an Intact Logical Group in logically sequential order to a newly allocated Erased metablock. The Logical Group and the metablock go to Sequential Update state. The previously Intact metablock becomes an Original metablock.

FIG. 14(G) shows state diagrams corresponding to the logical group and the metablock transitions for a sequential fill operation. A Sequential Update Logical Group becomes Intact when all its sectors are written sequentially by the host. This may also occur during garbage collection when the Sequential Update Logical Group is filled with valid sectors from the original block in order to make it Intact, after which the original block is erased.

FIG. 14(H) shows state diagrams corresponding to the logical group and the metablock transitions for a non-sequential write operation. A Sequential Update Logical Group becomes Chaotic when at least one sector is written non-sequentially by the host. The non-sequential sector writes may cause valid sectors in either the Update block or the corresponding Original block to become obsolete.

Figures 14I, 14J:
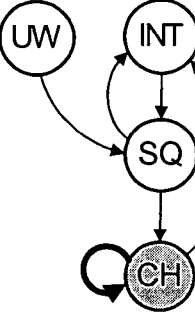

FIG. 14(I) shows state diagrams corresponding to the logical group and the metablock transitions for a compaction operation. All valid sectors within a Chaotic Update Logical Group are copied into a new chaotic metablock from the old block, which is then erased. The Original block is unaffected.

FIG. 14(J) shows state diagrams corresponding to the logical group and the metablock transitions for a consolidation operation. All valid sectors within a Chaotic Update Logical Group are copied from the old chaotic block and the Original block to fill a newly allocated Erased block in logically sequential order. The old chaotic block and the Original block are then erased.

Update Block Tracking and Management

Figure 15:
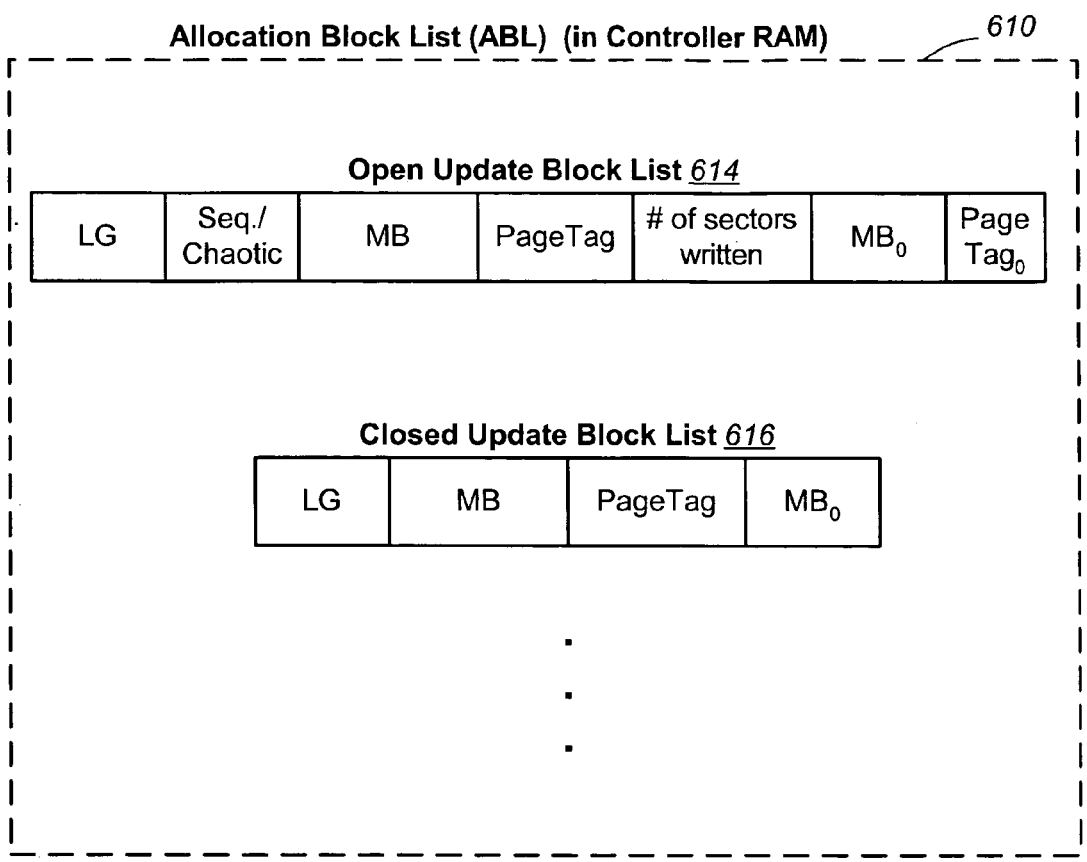
FIG. 15 illustrates a preferred embodiment of the structure of an allocation block list (ABL) for keeping track of opened and closed update blocks and erased blocks for allocation.

FIG. 15 illustrates a preferred embodiment of the structure of an allocation block list (ABL) for keeping track of opened and closed update blocks and erased blocks for allocation. The allocation block list (ABL) 610 is held in controller RAM 130, to allow management of allocation of erased blocks, allocated update blocks, associated blocks and control structures, and to enable correct logical to physical address translation. In the preferred embodiment, the ABL includes a list of erased blocks, an open update block list 614 and a closed update block list 616.

The open update block list 614 is the set of block entries in the ABL with the attributes of Open Update Block. The open update block list has one entry for each data update block currently open. Each entry holds the following information. LG is the logical group address the current update metablock is dedicated to. Sequential/Chaotic is a status indicating whether the update block has been filled with sequential or chaotic update data. MB is the metablock address of the update block. Page tag is the starting logical sector recorded at the first physical location of the update block. Number of sectors written indicates the number of sectors currently written onto the update block. $MB_0$ is the metablock address of the associated original block. Page $Tag_0$ is the page tag of the associated original block.

The closed update block list 616 is a subset of the Allocation Block List (ABL). It is. the set of block entries in the ABL with the attributes of Closed Update Block. The closed update block list has one entry for each data update block which has been closed, but whose entry has not been updated in a logical to a main physical directory. Each entry holds the following information. LG is the logical group address the current update block is dedicated to. MB is the metablock address of the update block. Page tag is the starting logical sector recorded at the first physical location of the update block. $MB_0$ is the metablock address of the associated original block.

Chaotic Block Indexing

A sequential update block has the data stored in logically sequential order, thus any logical sector among the block can be located easily. A chaotic update block has its logical sectors stored out of order and may also store multiple update generations of a logical sector. Additional information must be maintained to keep track of where each valid logical sector is located in the chaotic update block.

In the preferred embodiment, chaotic block indexing data structures allow tracking and fast access of all valid sectors in a chaotic block. Chaotic block indexing independently manages small regions of logical address space, and efficiently handles system data and hot regions of user data. The indexing data structures essentially allow indexing information to be maintained in flash memory with infrequent update requirement so that performance is not significantly impacted. On the other hand, lists of recently written sectors in chaotic blocks are held in a chaotic sector list in controller RAM. Also, a cache of index information from flash memory is held in controller RAM in order to minimize the number of flash sector accesses for address translation. Indexes for each chaotic block are stored in chaotic block index (CBI) sectors in flash memory.

Figures 16A, 16B:
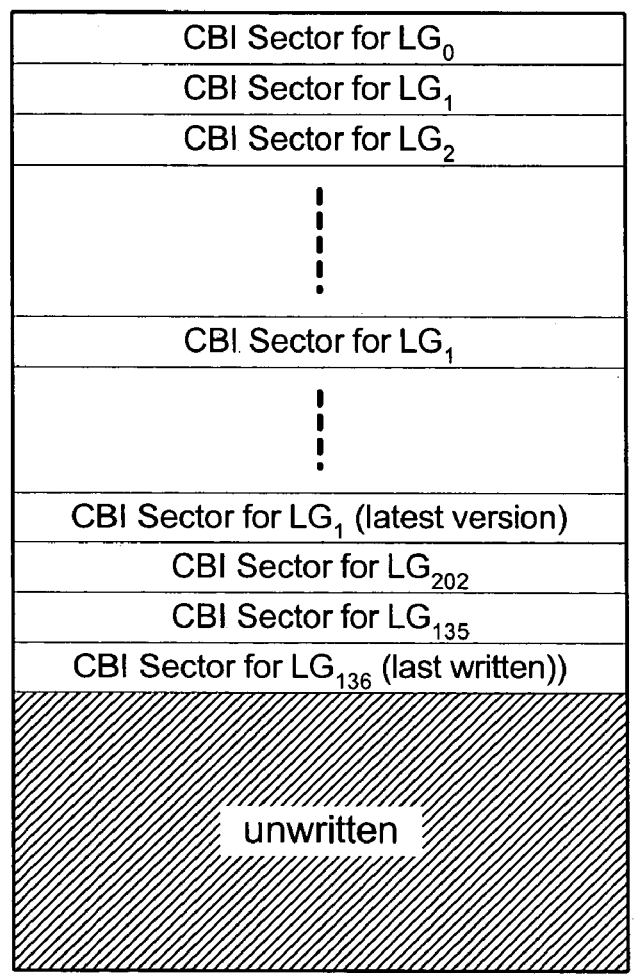
FIG. 16A illustrates the data fields of a chaotic block index (CBI) sector.
FIG. 16B illustrates an example of the chaotic block index (CBI) sectors being recorded in a dedicated metablock.

FIG. 16A illustrates the data fields of a chaotic block index (CBI) sector. A Chaotic Block Index Sector (CBI sector) contains an index for each sector in a logical group mapped to a chaotic update block, defining the location of each sector of the logical group within the chaotic update block or its associated original block. A CBI sector includes a chaotic block index field for keeping track of valid sectors within the chaotic block, a chaotic block info field for keeping track of address parameters for the chaotic block, and a sector index field for keeping track of the valid CBI sectors within the metablock (CBI block) storing the CBI sectors.

FIG. 16B illustrates an example of the chaotic block index (CBI) sectors being recorded in a dedicated metablock. The dedicated metablock will be referred to as a CBI block 620. When a CBI sector is updated, it is written in the next available physical sector location in the CBI block 620. Multiple copies of a CBI sector may therefore exist in the CBI block, with only the last written copy being valid. For example the CBI sector for the logical group LGI has been updated three times with the latest version being the valid one. The location of each valid sector in the CBI block is identified by a set of indices in the last written CBI sector in the block. In this example, the last written CBI sector in the block is CBI sector for $LG_{136}$ and its set of indices is the valid one superceding all previous ones. When the CBI block eventually becomes fully filled with CBI sectors, the block is compacted during a control write operation by rewriting all valid sectors to a new block location. The full block is then erased.

The chaotic block index field within a CBI sector contains an index entry for each logical sector within a logical group or sub-group mapped to a chaotic update block. Each index entry signifies an offset within the chaotic update block at which valid data for the corresponding logical sector is located. A reserved index value indicates that no valid data for the logical sector exists in the chaotic update block, and that the corresponding sector in the associated original block is valid. A cache of some chaotic block index field entries is held in controller RAM.

The chaotic block info field within a CBI sector contains one entry for each chaotic update block that exists in the system, recording address parameter information for the block. Information in this field is only valid in the last written sector in the CBI block. This information is also present in data structures in RAM.

The entry for each chaotic update block includes three address parameters. The first is the logical address of the logical group (or logical group number) associated with the chaotic update block. The second is the metablock address of the chaotic update block. The third is the physical address offset of the last sector written in the chaotic update block. The offset information sets the start point for scanning of the chaotic update block during initialization, to rebuild data structures in RAM.

The sector index field contains an entry for each valid CBI sector in the CBI block. It defines the offsets within the CBI block at which the most recently written CBI sectors relating to each permitted chaotic update block are located. A reserved value of an offset in the index indicates that a permitted chaotic update block does not exist.

Figure 16C:
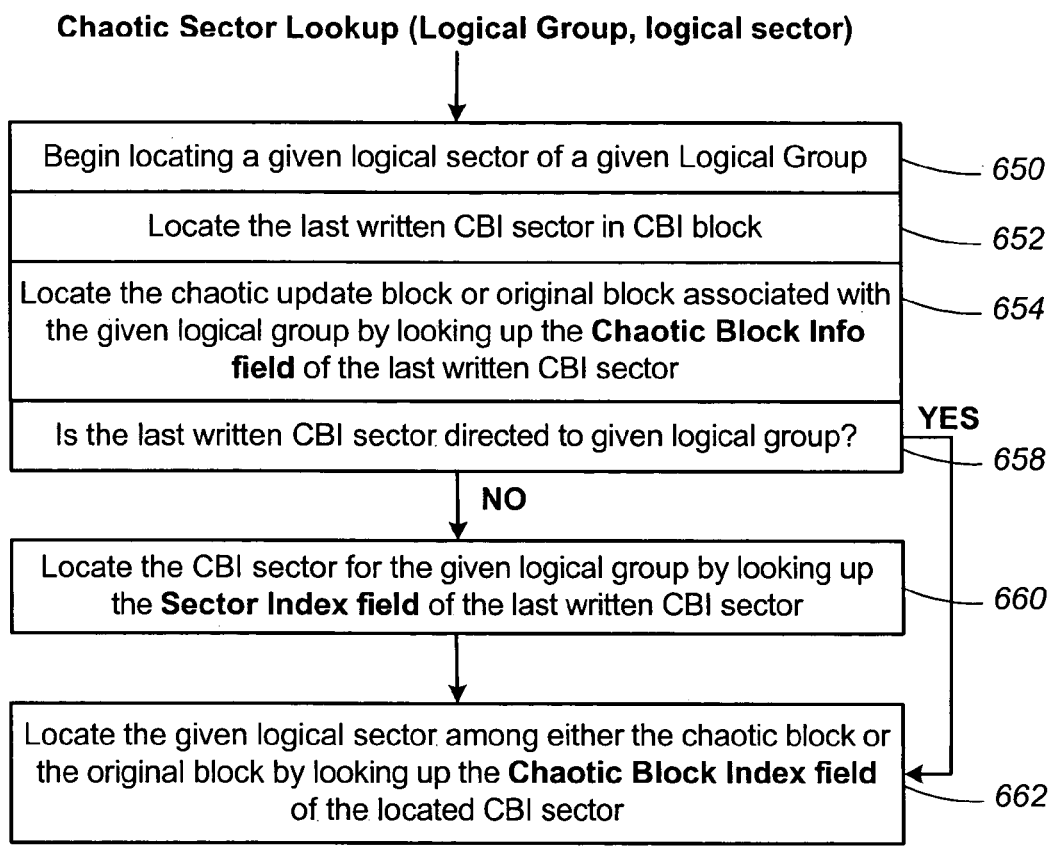
FIG. 16C is a flow diagram illustrating access to the data of a logical sector of a given logical group undergoing chaotic update.

FIG. 16C is a flow diagram illustrating access to the data of a logical sector of a given logical group undergoing chaotic update. During the update process, the update data is recorded in the chaotic update block while the unchanged data remains in the original metablock associated with the logical group. The process of accessing a logical sector of the logical group under chaotic update is as follows:

STEP 650: Begin locating a given logical sector of a given logical group.

STEP 652: Locate last written CBI sector in the CBI block

STEP 654: Locate the chaotic update block or original block associated with the given logical group by looking up the Chaotic Block Info field of the last written CBI sector. This step can be performed any time just before STEP 662.

STEP 658: If the last written CBI sector is directed to the given logical group, the CBI sector is located. Proceed to STEP 662. Otherwise, proceed to STEP 660.

STEP 660: Locate the CBI sector for the given logical group by looking up the sector index field of the last written CBI sector.

STEP 662: Locate the given logical sector among either the chaotic block or the original block by looking up the Chaotic Block Index field of the located CBI sector.

Figure 16D:
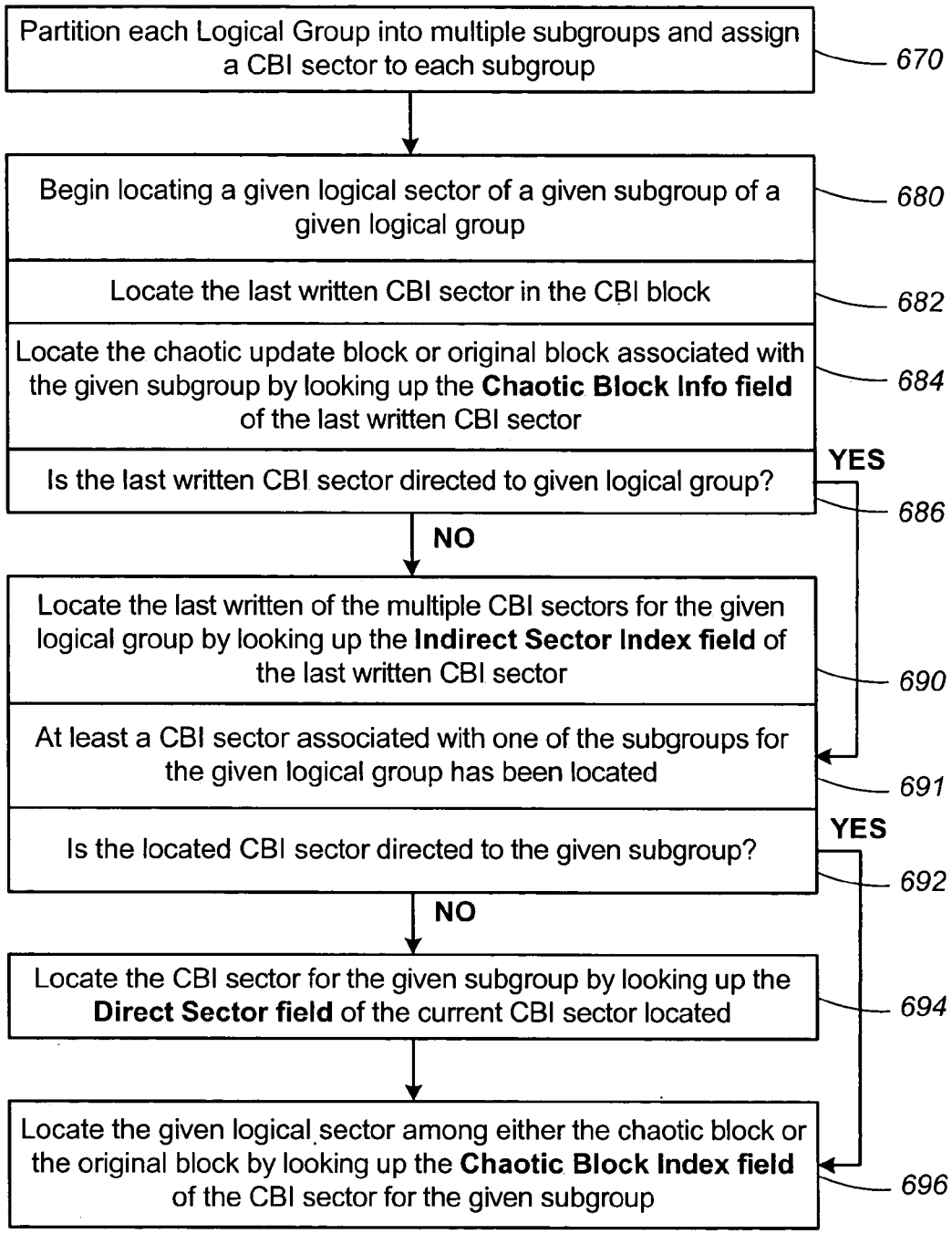
FIG. 16D is a flow diagram illustrating access to the data of a logical sector of a given logical group undergoing chaotic update, according to an alternative embodiment in which logical group has been partitioned into subgroups.

FIG. 16D is a flow diagram illustrating access to the data of a logical sector of a given logical group undergoing chaotic update, according to an alternative embodiment in which logical group has been partitioned into subgroups. The finite capacity of a CBI sector can only keep track of a predetermined maximum number of logical sectors. When the logical group has more logical sectors than a single CBI sector can handle, the logical group is partitioned into multiple subgroups with a CBI sector assigned to each subgroup. In one example, each CBI sector has enough capacity for tracking a logical group consisting of 256 sectors and up to 8 chaotic update blocks. If the logical group has a size exceeding 256 sectors, a separate CBI sector exists for each 256-sector sub-group within the logical group. CBI sectors may exist for up to 8 sub-groups within a logical group, giving support for logical groups up to 2048 sectors in size.

In the preferred embodiment, an indirect indexing scheme is employed to facilitate management of the index. Each entry of the sector index has direct and indirect fields.

The direct sector index defines the offsets within the CBI block at which all possible CBI sectors relating to a specific chaotic update block are located. Information in this field is only valid in the last written CBI sector relating to that specific chaotic update block. A reserved value of an offset in the index indicates that the CBI sector does not exist because the corresponding logical subgroup relating to the chaotic update block either does not exist, or has not been updated since the update block was allocated.

The indirect sector index defines the offsets within the CBI block at which the most recently written CBI sectors relating to each permitted chaotic update block are located. A reserved value of an offset in the index indicates that a permitted chaotic update block does not exist.

FIG. 16D shows the process of accessing a logical sector of the logical group under chaotic update as follows:

STEP 670: Partition each Logical Group into multiple subgroups and assign a CBI sector to each subgroup STEP 680: Begin locating a given logical sector of a given subgroup of a given logical group.

STEP 682: Locate the last written CBI sector in the CBI block.

STEP 684: Locate the chaotic update block or original block associated with the given subgroup by looking up the Chaotic Block Info field of the last written CBI sector. This step can be performed any time just before STEP 696.

STEP 686: If the last written CBI sector is directed to the given logical group, proceed to STEP 691. Otherwise, proceed to STEP 690.

STEP 690: Locate the last written of the multiple CBI sectors for the given logical group by looking up the Indirect Sector Index field of the last written CBI sector.

STEP 691: At least a CBI sector associate with one of the subgroups for the given logical group has been located. Continue.

STEP 692: If the located CBI sector directed to the given subgroup, the CBI sector for the given subgroup is located. Proceed to STEP 696. Otherwise, proceed to STEP 694.

STEP 694: Locate the CBI sector for the given subgroup by looking up the direct sector index field of the currently located CBI sector.

STEP 696: Locate the given logical sector among either the chaotic block or the original block by looking up the Chaotic Block Index field of the CBI sector for the given subgroup.

Figure 16E:
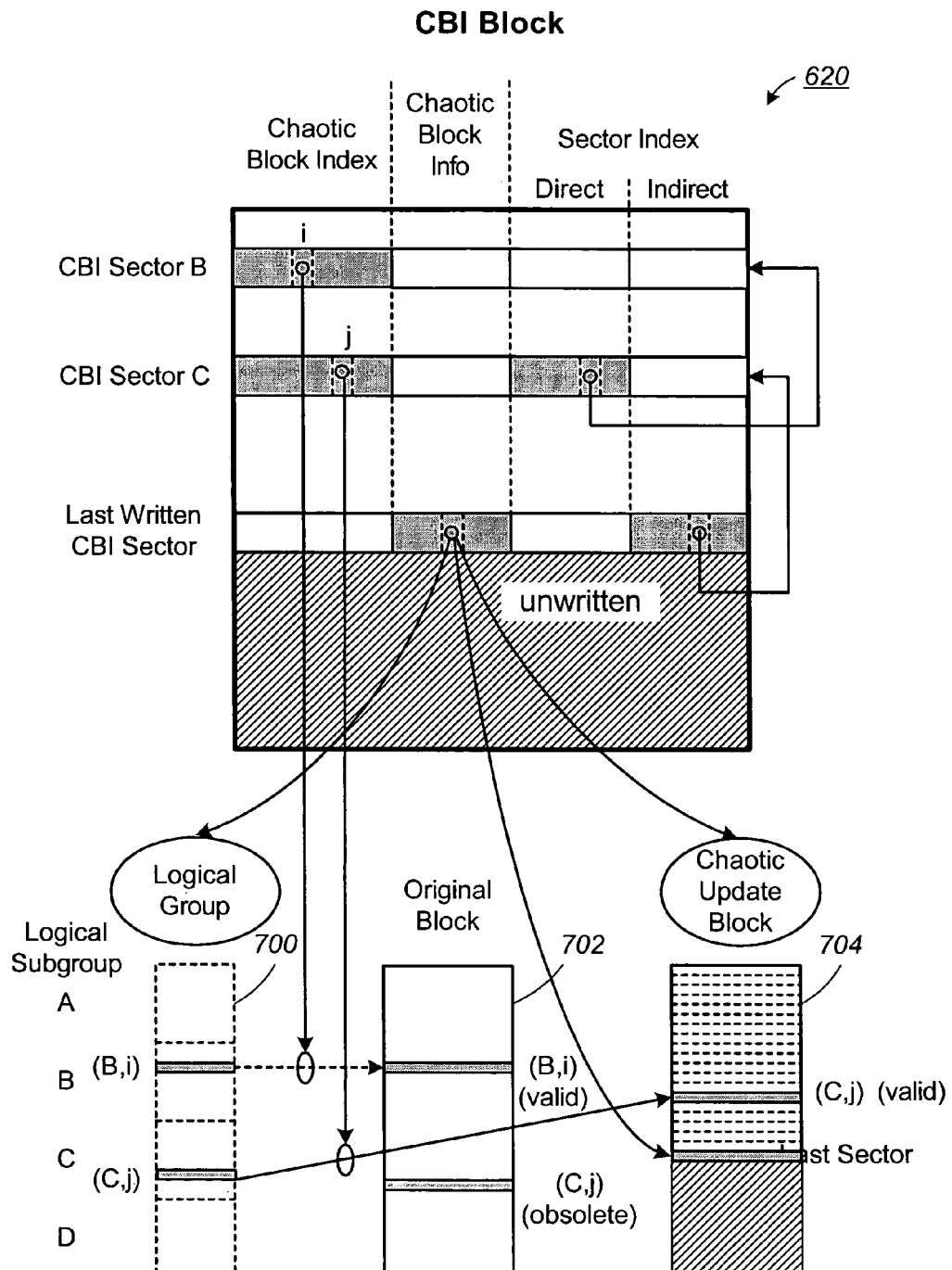
FIG. 16E illustrates examples of Chaotic Block Indexing (CBI) sectors and their functions for the embodiment where each logical group is partitioned into multiple subgroups.

FIG. 16E illustrates examples of Chaotic Block Indexing (CBI) sectors and their functions for the embodiment where each logical group is partitioned into multiple subgroups. A logical group 700 originally has its intact data stored in an original metablock 702. The logical group is then undergoing updates with the allocation of a dedicated chaotic update block 704. In the present examples, the logical group 700 is partitioned into subgroups, such subgroups A, B, C, D, each having 256 sectors.

In order to locate the ith sector in the subgroup B, the last written CBI sector in the CBI block 620 is first located. The chaotic block info field of the last written CBI sector provides the address to locate the chaotic update block 704 for the given logical group. At the same time it provides the location of the last sector written in the chaotic block. This information is useful in the event of scanning and rebuilding indices.

If the last written CBI sector turns out to be one of the four CBI sectors of the given logical group, it will be further determined if it is exactly the CBI sector for the given subgroup B that contains the ith logical sector. If it is, then the CBI sector's chaotic block index will point to the metablock location for storing the data for the ith logical sector. The sector location could be either in the chaotic update block 704 or the original block 702.

If the last written CBI sector turns out to be one of the four CBI sectors of the given logical group but is not exactly for the subgroup B, then its direct sector index is looked up to locate the CBI sector for the subgroup B. Once this exact CBI sector is located, its chaotic block index is looked up to locate the ith logical sector among the chaotic update block 704and the original block 702.

If the last written CBI sector turns out not to be anyone of the four CBI sectors of the given logical group, its indirect sector index is looked up to locate one of the four. In the example shown in FIG. 16E, the CBI sector for subgroup C is located. Then this CBI sector for subgroup C has its direct sector index looked up to locate the exact CBI sector for the subgroup B. The example shows that when its chaotic block index is looked up, the ith logical sector is found to be unchanged and it valid data will be located in the original block.

Similar consideration applies to locating the jth logical sector in subgroup C of the given logical group. The example shows that the last written CBI sector turns out not to be any one of the four CBI sectors of the given logical group. Its indirect sector index points to one of the four CBI sectors for the given group. The last written of four pointed to also turns out to be exactly the CBI sector for the subgroup C. When its chaotic block index is looked up, the jth logical sector is found to be located at a designated location in the chaotic update block 704.

A list of chaotic sectors exists in controller RAM for each chaotic update block in the system. Each list contains a record of sectors written in the chaotic update block since a related CBI sector was last updated in flash memory. The number of logical sector addresses for a specific chaotic update block, which can be held in a chaotic sector list, is a design parameter with a typical value of 8 to 16. The optimum size of the list is determined as a tradeoff between its effects on overhead for chaotic data-write operations and sector scanning time during initialization.

During system initialization, each chaotic update block is scanned as necessary to identify valid sectors written since the previous update of one of its associated CBI sectors. A chaotic sector list in controller RAM for each chaotic update block is constructed. Each block need only be scanned from the last sector address defined in its chaotic block info field in the last written CBI sector.

When a chaotic update block is allocated, a CBI sector is written to correspond to all updated logical sub-groups. The logical and physical addresses for the chaotic update block are written in an available chaotic block info field in the sector, with null entries in the chaotic block index field. A chaotic sector list is opened in controller RAM.

When a chaotic update block is closed, a CBI sector is written with the logical and physical addresses of the block removed from the chaotic block info field in the sector. The corresponding chaotic sector list in RAM becomes unused.

The corresponding chaotic sector list in controller RAM is modified to include records of sectors written to a chaotic update block. When a chaotic sector list in controller RAM has no available space for records of further sector writes to a chaotic update block, updated CBI sectors are written for logical sub-groups relating to sectors in the list, and the list is cleared.

When the CBI block 620 becomes full, valid CBI sectors are copied to an allocated erased block, and the previous CBI block is erased.

Address Tables

The logical to physical address translation module 140 shown in FIG. 2 is responsible for relating a host's logical address to a corresponding physical address in flash memory. Mapping between logical groups and physical groups (metablocks) are stored in a set of table and lists distributed among the nonvolatile flash memory 200 and the volatile but more agile RAM 130 (see FIG. 1.) An address table is maintained in flash memory, containing a metablock address for every logical group in the memory system. In addition, logical to physical address records for recently written sectors are temporarily held in RAM. These volatile records can be reconstructed from block lists and data sector headers in flash memory when the system is initialized after power-up. Thus, the address table in flash memory need be updated only infrequently, leading to a low percentage of overhead write operations for control data.

The hierarchy of address records for logical groups includes the open update block list, the closed update block list in RAM and the group address table (GAT) maintained in flash memory.

The open update block list is a list in controller RAM of data update blocks which are currently open for writing updated host sector data. The entry for a block is moved to the closed update block list when the block is closed. The closed update block list is a list in controller RAM of data update blocks which have been closed. A subset of the entries in the list is moved to a sector in the Group Address Table during a control write operation.

The Group Address Table (GAT) is a list of metablock addresses for all logical groups of host data in the memory system. The GAT contains one entry for each logical group, ordered sequentially according to logical address. The nth entry in the GAT contains the metablock address for the logical group with address n. In the preferred embodiment, it is a table in flash memory, comprising a set of sectors (referred to as GAT sectors) with entries defining metablock addresses for every logical group in the memory system. The GAT sectors are located in one or more dedicated control blocks (referred to as GAT blocks) in flash memory.

Figure 17A:
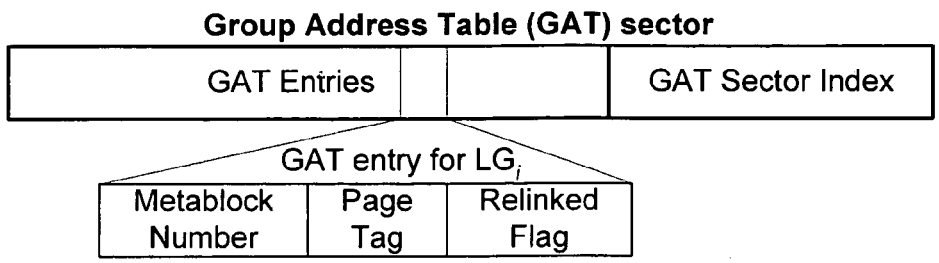
FIG. 17A illustrates the data fields of a group address table (GAT) sector.

FIG. 17A illustrates the data fields of a group address table (GAT) sector. A GAT sector may for example have sufficient capacity to contain GAT entries for a set of 128 contiguous logical groups. Each GAT sector includes two components, namely a set of GAT entries for the metablock address of each logical group within a range, and a GAT sector index. The first component contains information for locating the metablock associated with the logical address. The second component contains information for locating all valid GAT sectors within the GAT block. Each GAT entry has three fields, namely, the metablock number, the page tag as defined earlier in connection with FIG. 3A(iii), and a flag indicating whether the metablock has been relinked. The GAT sector index lists the positions of valid GAT sectors in a GAT block. This index is in every GAT sector but is superceded by the version of the next written GAT sector in the GAT block. Thus only the version in the last written GAT sector is valid.

Figure 17B:
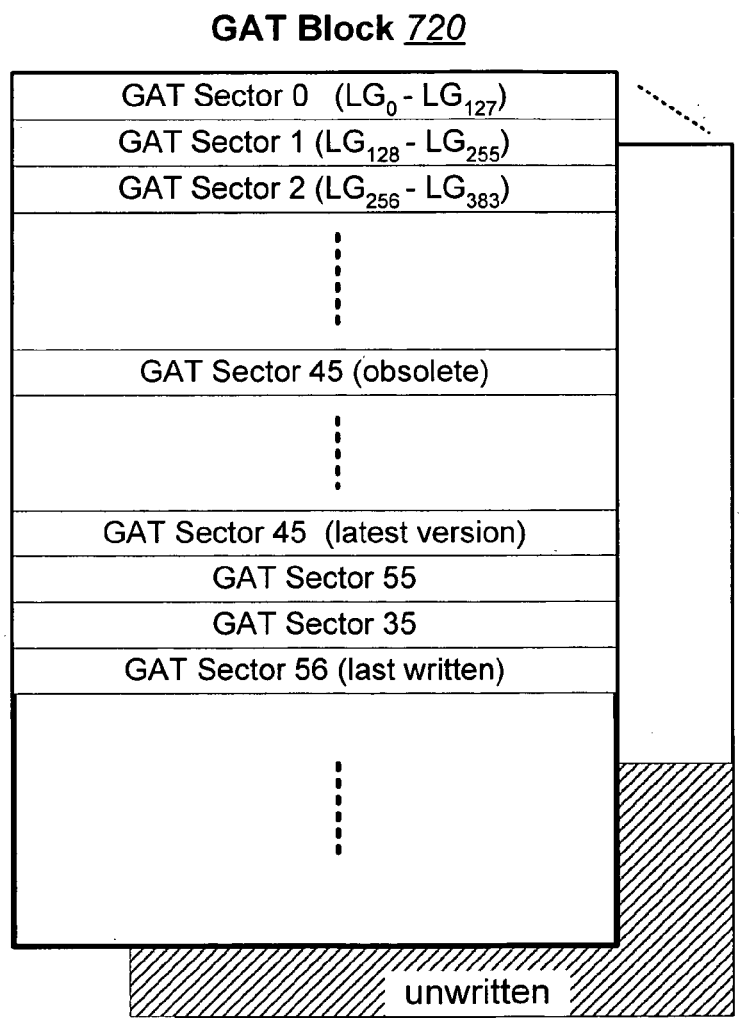
FIG. 17B illustrates an example of the group address table (GAT) sectors being recorded in a GAT block.

FIG. 17B illustrates an example of the group address table (GAT) sectors being recorded in one or more GAT block. A GAT block is a metablock dedicated to recording GAT sectors. When a GAT sector is updated, it is written in the next available physical sector location in the GAT block 720. Multiple copies of a GAT sector may therefore exist in the GAT block, with only the last written copy being valid. For example the GAT sector 45 has been updated at least two times with the latest version being the valid one. The location of each valid sector in the GAT block is identified by a set of indices in the last written GAT sector in the block. In this example, the last written GAT sector in the block is GAT sector 56 and its set of indices is the valid one superceding all previous ones. When the GAT block eventually becomes fully filled with GAT sectors, the block is compacted during a control write operation by rewriting all valid sectors to a new block location. The full block is then erased.

As described earlier, a GAT block contains entries for a logically contiguous set of groups in a region of logical address space. GAT sectors within a GAT block each contain logical to physical mapping information for 128 contiguous logical groups. The number of GAT sectors required to store entries for all logical groups within the address range spanned by a GAT block occupy only a fraction of the total sector positions in the block. A GAT sector may therefore be updated by writing it at the next available sector position in the block. An index of all valid GAT sectors and their position in the GAT block is maintained in an index field in the most recently written GAT sector. The fraction of the total sectors in a GAT block occupied by valid GAT sectors is a system design parameter, which is typically 25%. However, there is a maximum of 64 valid GAT sectors per GAT block. In systems with large logical capacity, it may be necessary to store GAT sectors in more than one GAT block. In this case, each GAT block is associated with a fixed range of logical groups.

Figure 18:
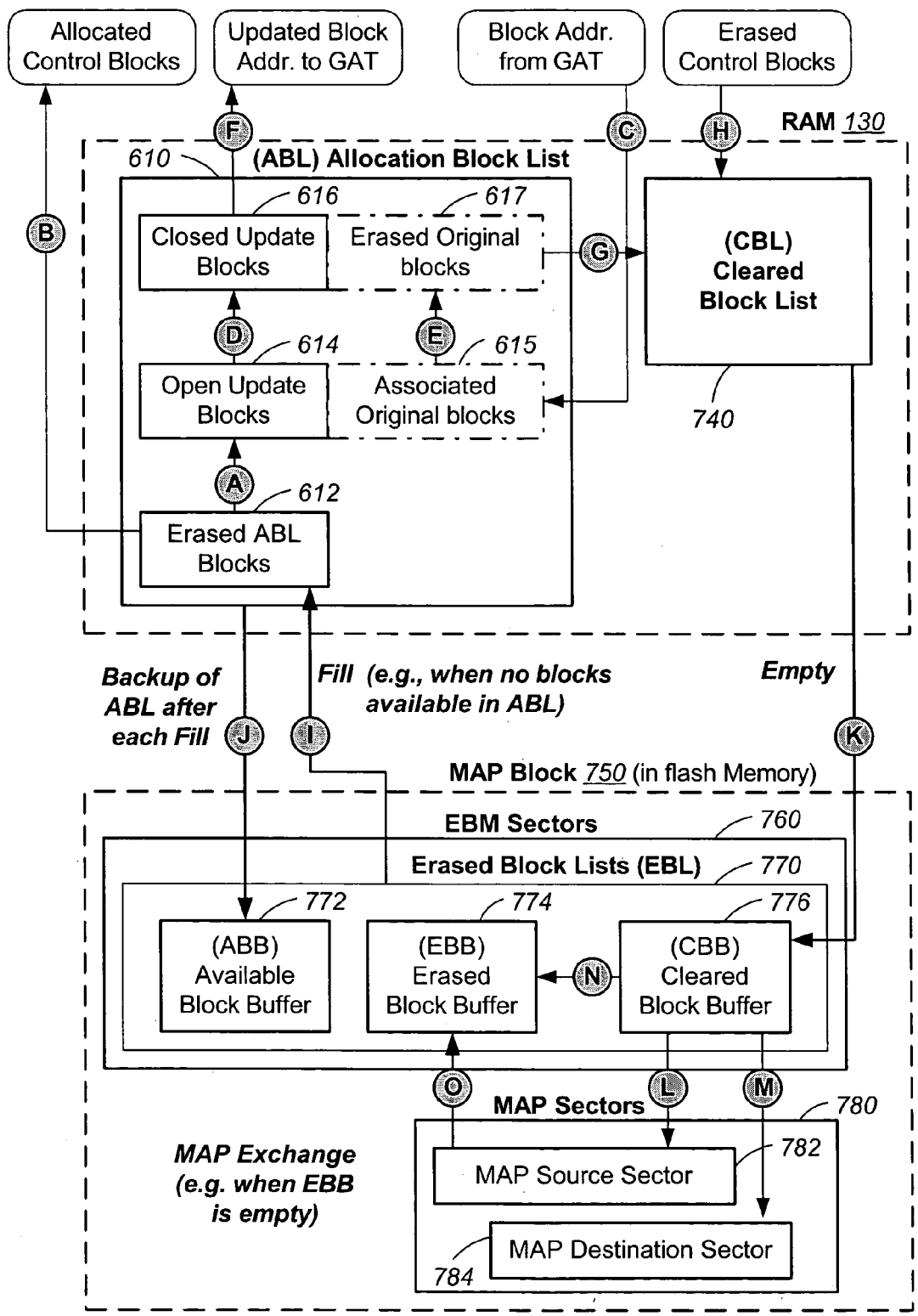
FIG. 18 is a schematic block diagram illustrating the distribution and flow of the control and directory information for usage and recycling of erased blocks.

A GAT update is performed as part of a control write operation, which is triggered when the ABL runs out of blocks for allocation (see FIG. 18.) It is performed concurrently with ABL fill and CBL empty operations. During a GAT update operation, one GAT sector has entries updated with information from corresponding entries in the closed update block list. When a GAT entry is updated, any corresponding entries are removed from the closed update block list (CUBL). For example, the GAT sector to be updated is selected on the basis of the first entry in the closed update block list. The updated sector is written to the next available sector location in the GAT block.

A GAT rewrite operation occurs during a control write operation when no sector location is available for an updated GAT sector. A new GAT block is allocated, and valid GAT sectors as defined by the GAT index are copied in sequential order from the full GAT block. The full GAT block is then erased.

A GAT cache is a copy in controller RAM 130 of entries in a subdivision of the 128 entries in a GAT sector. The number of GAT cache entries is a system design parameter, with typical value 32. A GAT cache for the relevant sector subdivision is created each time an entry is read from a GAT sector. Multiple GAT caches are maintained. The number is a design parameter with a typical value of 4. A GAT cache is overwritten with entries for a different sector subdivision on a least-recently-used basis.

Erased Metablock Management

The erase block manager 160 shown in FIG. 2 manages erase blocks using a set of lists for maintaining directory and system control information. These lists are distributed among the controller RAM 130 and flash memory 200. When an erased metablock must be allocated for storage of user data, or for storage of system control data structures, the next available metablock number in the allocation block list (ABL) (see FIG. 15) held in controller RAM is selected. Similarly, when a metablock is erased after it has been retired, its number is added to a cleared block list (CBL) also held in controller RAM. Relatively static directory and system control data are stored in flash memory. These include erased block lists and a bitmap (MAP) listing the erased status of all metablocks in the flash memory. The erased block lists and MAP are stored in individual sectors and are recorded to a dedicated metablock, known as a MAP block. These lists, distributed among the controller RAM and flash memory, provide a hierarchy of erased block records to efficiently manage erased metablock usage.

FIG. 18 is a schematic block diagram illustrating the distribution and flow of the control and directory information for usage and recycling of erased blocks. The control and directory data are maintained in lists which are held either in controller RAM 130 or in a MAP block 750 residing in flash memory 200.

In the preferred embodiment, the controller RAM 130 holds the allocation block list (ABL) 610 and a cleared block list (CBL) 740. As described earlier in connection with FIG. 15, the allocation block list (ABL) keeps track of which metablocks have recently been allocated for storage of user data, or for storage of system control data structures. When a new erased metablock need be allocated, the next available metablock number in the allocation block list (ABL) is selected. Similarly, the cleared block list (CBL) is used to keep track of update metablocks that have been de-allocated and erased. The ABL and CBL are held in controller RAM 130 (see FIG. 1) for speedy access and easy manipulation when tracking the relatively active update blocks.

The allocation block list (ABL) keeps track of a pool of erased metablocks and the allocation of the erased metablocks to be an update block. Thus, each of these metablocks that may be described by an attribute designating whether it is an erased block in the ABL pending allocation, an open update block, or a closed update block. FIG. 18 shows the ABL containing an erased ABL list 612, the open update block list 614 and the closed update block list 616. In addition, associated with the open update block list 614 is the associated original block list 615. Similarly, associated with the closed update block list is the associated erased original block list 617. As shown previously in FIG. 15, these associated lists are subset of the open update block list 614 and the closed update block list 616 respectively. The erased ABL block list 612, the open update block list 614, and the closed update block list 616 are all subsets of the allocation block list (ABL) 610, the entries in each having respectively the corresponding attribute.

The MAP block 750 is a metablock dedicated to storing erase management records in flash memory 200. The MAP block stores a time series of MAP block sectors, with each MAP sector being either an erase block management (EBM) sector 760 or a MAP sector 780. As erased blocks are used up in allocation and recycled when a metablock is retired, the associated control and directory data is preferably contained in a logical sector which may be updated in the MAP block, with each instance of update data being recorded to a new block sector. Multiple copies of EBM sectors 760 and MAP sectors 780 may exist in the MAP block 750, with only the latest version being valid. An index to the positions of valid MAP sectors is contained in a field in the EMB block. A valid EMB sector is always written last in the MAP block during a control write operation. When the MAP block 750 is full, it is compacted during a control write operation by rewriting all valid sectors to a new block location. The full block is then erased.

Each EBM sector 760 contains erased block lists (EBL) 770, which are lists of addresses of a subset of the population of erased blocks. The erased block lists (EBL) 770 act as a buffer containing erased metablock numbers, from which metablock numbers are periodically taken to re-fill the ABL, and to which metablock numbers are periodically added to re-empty the CBL. The EBL 770 serves as buffers for the available block buffer (ABB) 772, the erased block buffer (EBB) 774 and the cleared block buffer (CBB) 776.

The available block buffer (ABB) 772 contains a copy of the entries in the ABL 610 immediately following the previous ABL fill operation. It is in effect a backup copy of the ABL just after an ABL fill operation.

The erased block buffer (EBB) 774 contains erased block addresses which have been previously transferred either from MAP sectors 780 or from the CBB list 776 (described below), and which are available for transfer to the ABL 610 during an ABL fill operation.

The cleared block buffer (CBB) 776 contains addresses of erased blocks which have been transferred from the CBL 740 during a CBL empty operation and which will be subsequently transferred to MAP sectors 780 or to the EBB list 774.

Each of the MAP sectors 780 contains a bitmap structure referred to as MAP. The MAP uses one bit for each metablock in flash memory, which is used to indicate the erase status of each block. Bits corresponding to block addresses listed in the ABL, CBL, or erased block lists in the EBM sector are not set to the erased state in the MAP.

Any block which does not contain valid data structures and which is not designated as an erased block within the MAP, erased block lists, ABL or CBL is never used by the block allocation algorithm and is therefore inaccessible for storage of host or control data structures. This provides a simple mechanism for excluding blocks with defective locations from the accessible flash memory address space.

The hierarchy shown in FIG. 18 allows erased block records to be managed efficiently and provides full security of the block address lists stored in the controller's RAM. Erased block entries are exchanged between these block address lists and one or more MAP sectors 780, on an infrequent basis. These lists may be reconstructed during system initialization after a power-down, via information in the erased block lists and address translation tables stored in sectors in flash memory, and limited scanning of a small number of referenced data blocks in flash memory.

The algorithms adopted for updating the hierarchy of erased metablock records results in erased blocks being allocated for use in an order which interleaves bursts of blocks in address order from the MAP block 750 with bursts of block addresses from the CBL 740 which reflect the order blocks were updated by the host. For most metablock sizes and system memory capacities, a single MAP sector can provide a bitmap for all metablocks in the system. In this case, erased blocks are always allocated for use in address order as recorded in this MAP sector.

Erase Block Management Operations

As described earlier, the ABL 610 is a list with address entries for erased metablocks which may be allocated for use, and metablocks which have recently been allocated as data update blocks. The actual number of block addresses in the ABL lies between maximum and minimum limits, which are system design variables. The number of ABL entries formatted during manufacturing is a function of the card type and capacity. In addition, the number of entries in the ABL may be reduced near the end of life of the system, as the number of available erased blocks is reduced by failure of blocks during life. For example, after a fill operation, entries in the ABL may designate blocks available for the following purposes. Entries for Partially written data update blocks with one entry per block, not exceeding a system limit for a maximum of concurrently opened update blocks. Between one to twenty entries for Erased blocks for allocation as data update blocks. Four entries for erased blocks for allocation as control blocks.

ABL Fill Operation

As the ABL 610 becomes depleted through allocations, it will need to be refilled. An operation to fill the ABL occurs during a control write operation. This is triggered when a block must be allocated, but the ABL contains insufficient erased block entries available for allocation as a data update block, or for some other control data update block. During a control write, the ABL fill operation is concurrent with a GAT update operation.

The following actions occur during an ABL fill operation.
1. ABL entries with attributes of current data update blocks are retained.
2. ABL entries with attributes of closed data update blocks are retained, unless an entry for the block is being written in the concurrent GAT update operation, in which case the entry is removed from the ABL.
3. ABL entries for unallocated erase blocks are retained.
4. The ABL is compacted to remove gaps created by removal of entries, maintaining the order of entries.
5. The ABL is completely filled by appending the next available entries from the EBB list.
6. The ABB list is over-written with the current entries in the ABL.

CBL Empty Operation

The CBL is a list of erased block addresses in controller RAM with the same limitation on the number of erased block entries as the ABL. An operation to empty the CBL occurs during a control write operation. It is therefore concurrent with an ABL fill/GAT update operations, or CBI block write operations. In a CBL empty operation, entries are removed from the CBL 740 and written to the CBB list 776.

MAP Exchange Operation

A MAP exchange operation between the erase block information in the MAP sectors 780 and the EBM sectors 760 may occur periodically during a control write operation, when the EBB list 774 is empty. If all erased metablocks in the system are recorded in the EBM sector 760, no MAP sector 780 exists and no MAP exchange is performed. During a MAP exchange operation, a MAP sector feeding the EBB 774 with erased blocks is regarded as a source MAP sector 782. Conversely, a MAP sector receiving erased blocks from the CBB 776 is regarded as a destination MAP sector 784. If only one MAP sector exists, it acts as both source and destination MAP sector, as defined below.

The following actions are performed during a MAP exchange.
1. A source MAP sector is selected, on the basis of an incremental pointer.
2. A destination MAP sector is selected, on the basis of the block address in the first CBB entry that is not in the source MAP sector.
3. The destination MAP sector is updated, as defined by relevant entries in the CBB, and the entries are removed from the CBB.
4. The updated destination MAP sector is written in the MAP block, unless no separate source MAP sector exists.
5. The source MAP sector is updated, as defined by relevant entries in the CBB, and the entries are removed from the CBB.
6. Remaining entries in the CBB are appended to the EBB.
7. The EBB is filled to the extent possible with erased block addresses defined from the source MAP sector.
8. The updated source MAP sector is written in the MAP block.
9. An updated EBM sector is written in the MAP block.

List Management

FIG. 18 shows the distribution and flow of the control and directory information between the various lists. For expediency, operations to move entries between elements of the lists or to change the attributes of entries, identified in FIG. 18 as [A] to [O], are as follows.

[A] When an erased block is allocated as an update block for host data, the attributes of its entry in the ABL are changed from Erased ABL Block to Open Update Block.
[B] When an erased block is allocated as a control block, its entry in the ABL is removed.
[C] When an ABL entry is created with Open Update Block attributes, an Associated Original Block field is added to the entry to record the original metablock address for the logical group being updated. This information is obtained from the GAT.
[D] When an update block is closed, the attributes of its entry in the ABL are changed from Open Update Block to Closed Update Block.
[E] When an update block is closed, its associated original block is erased and the attributes of the Associated Original Block field in its entry in the ABL are changed to Erased Original Block.
[F] During an ABL fill operation, any closed update block whose address is updated in the GAT during the same control write operation has its entry removed from the ABL.
[G] During an ABL fill operation, when an entry for a closed update block is removed from the ABL, an entry for its associated erased original block is moved to the CBL.
[H] When a control block is erased, an entry for it is added to the CBL.
[I] During an ABL fill operation, erased block entries are moved to the ABL from the EBB list, and are given attributes of Erased ABL Blocks.
[J] After modification of all relevant ABL entries during an ABL fill operation, the block addresses in the ABL replace the block addresses in the ABB list.
[K] Concurrently with an ABL fill operation during a control write, entries for erased blocks in the CBL are moved to the CBB list.
[L] During a MAP exchange operation, all relevant entries are moved from the CBB list to the MAP destination sector.
[M] During a MAP exchange operation, all relevant entries are moved from the CBB list to the MAP source sector.
[N] Subsequent to [L] and [M] during a MAP exchange operation, all remaining entries are moved from the CBB list to the EBB list.
[O] Subsequent to [N] during a MAP exchange operation, entries other than those moved in [M] are moved from the MAP source sector to fill the EBB list, if possible.

Logical to Physical Address Translation

To locate a logical sector's physical location in flash memory, the logical to physical address translation module 140 shown in FIG. 2 performs a logical to physical address translation. Except for those logical groups that have recently been updated, the bulk of the translation could be performed using the group address table (GAT) residing in the flash memory 200 or the GAT cache in controller RAM 130. Address translations for the recently updated logical groups will require looking up address lists for update blocks which reside mainly in controller RAM 130. The process for logical to physical address translation for a logical sector address is therefore dependent on the type of block associated with the logical group within which the sector is located. The types of blocks are: intact block, sequential data update block, chaotic data update block, closed data update block.

Figure 19:
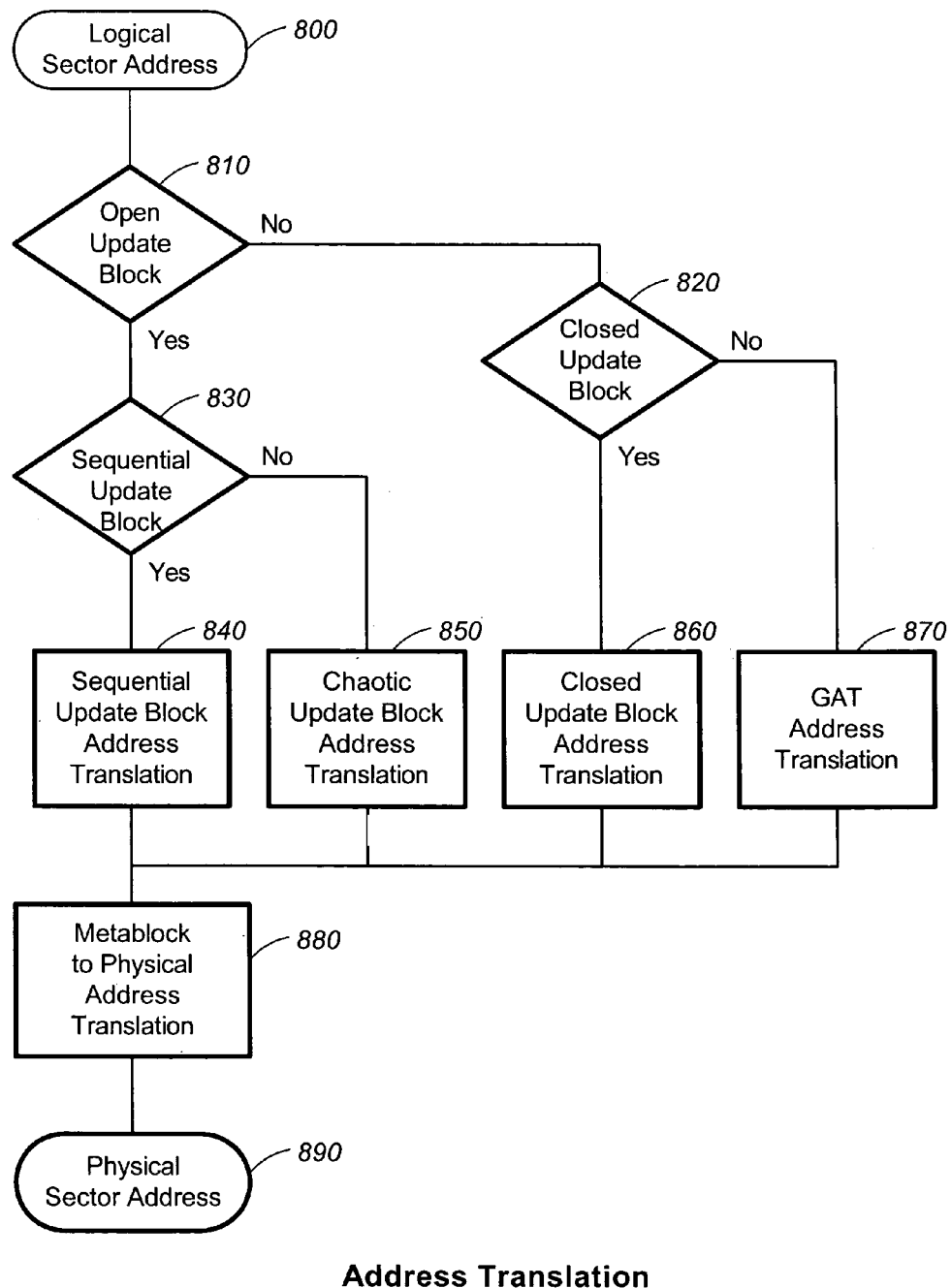
FIG. 19 is a flow chart showing the process of logical to physical address translation.

FIG. 19 is a flow chart showing the process of logical to physical address translation. Essentially, the corresponding metablock and the physical sector is located by using the logical sector address first to lookup the various update directories such as the open update block list and the close update block list. If the associated metablock is not part of an update process, then directory information is provided by the GAT. The logical to physical address translation includes the following steps:

STEP 800: A logical sector address is given.
STEP 810: Look up given logical address in the open update blocks list 614 (see FIGS. 15 and 18) in controller RAM. If lookup fails, proceed to STEP 820, otherwise proceed to STEP 830.
STEP 820: Look up given logical address in the closed update block list 616. If lookup fails, the given logical address is not part of any update process; proceed to STEP 870 for GAT address translation. Otherwise proceed to STEP 860 for closed update block address translation.
STEP 830: If the update block containing the given logical address is sequential, proceed to STEP 840 for sequential update block address translation. Otherwise proceed to STEP 850 for chaotic update block address translation.
STEP 840: Obtain the metablock address using sequential update block address translation. Proceed to STEP 880.
STEP 850: Obtain the metablock address using chaotic update block address translation. Proceed to STEP 880.
STEP 860: Obtain the metablock address using closed update block address translation. Proceed to STEP 880.
STEP 870: Obtain the metablock address using group address table (GAT) translation. Proceed to STEP 880.
STEP 880: Convert the Metablock Address to a physical address. The translation method depends on whether the metablock has been relinked.
STEP 890: Physical sector address obtained.

The various address translation processes are described in more detail as follows:

Sequential Update Block Address Translation (STEP 840)

Address translation for a target logical sector address in a logical group associated with a sequential update block can be accomplished directly from information in the open update block list 614 (FIGS. 15 and 18), as follows.

1. It is determined from the "page tag" and "number of sectors written" fields in the list whether the target logical sector is located in the update block or its associated original block.
2. The metablock address appropriate to the target logical sector is read from the list.
3. The sector address within the metablock is determined from the appropriate "page tag" field.

Chaotic Update Block Address Translation (STEP 850)

The address translation sequence for a target logical sector address in a logical group associated with a chaotic update block is as follows.

1. If it is determined from the chaotic sector list in RAM that the sector is a recently written sector, address translation may be accomplished directly from its position in this list.
2. The most recently written sector in the CBI block contains, within its chaotic block data field, the physical address of the chaotic update block relevant to the target logical sector address. It also contains, within its indirect sector index field, the offset within the CBI block of the last written CBI sector relating to this chaotic update block (see FIGS. 16A–16E).
3. The information in these fields is cached in RAM, eliminating the need to read the sector during subsequent address translation.
4. The CBI sector identified by the indirect sector index field at step 3 is read.
5. The direct sector index field for the most recently accessed chaotic update sub-group is cached in RAM, eliminating the need to perform the read at step 4 for repeated accesses to the same chaotic update block.
6. The direct sector index field read at step 4 or step 5 identifies in turn the CBI sector relating to the logical sub-group containing the target logical sector address.
7. The chaotic block index entry for the target logical sector address is read from the CBI sector identified in step 6.
8. The most recently read chaotic block index field may be cached in controller RAM, eliminating the need to perform the reads at step 4 and step 7 for repeated accesses to the same logical sub-group.
9. The chaotic block index entry defines the location of the target logical sector either in the chaotic update block or in the associated original block. If the valid copy of the target logical sector is in the original block, it is located by use of the original metablock and page tag information.

Closed Update Block Address Translation (STEP 860)

Address translation for a target logical sector address in a logical group associated with a closed update block can be accomplished directly from information in the closed block update list (see FIGS. 18), as follows.
1. The metablock address assigned to the target logical group is read from the list.
2. The sector address within the metablock is determined from the "page tag" field in the list.

GAT Address Translation (STEP 870)

If a logical group is not referenced by either the open or closed block update lists, its entry in the GAT is valid. The address translation sequence for a target logical sector address in a logical group referenced by the GAT is as follows.
1. The ranges of the available GAT caches in RAM are evaluated to determine if an entry for the target logical group is contained in a GAT cache.
2. If the target logical group is found in step 1, the GAT cache contains full group address information, including both metablock address and page tag, allowing translation of the target logical sector address.
3. If the target address is not in a GAT cache, the GAT index must be read for the target GAT block, to identify the location of the GAT sector relating to the target logical group address.
4. The GAT index for the last accessed GAT block is held in controller RAM, and may be accessed without need to read a sector from flash memory.
5. A list of metablock addresses for every GAT block, and the number of sectors written in each GAT block, is held in controller RAM. If the required GAT index is not available at step 4, it may therefore be read immediately from flash memory.
6. The GAT sector relating to the target logical group address is read from the sector location in the GAT block defined by the GAT index obtained at step 4 or step 6. A GAT cache is updated with the subdivision of the sector containing the target entry.
7. The target sector address is obtained from the metablock address and "page tag" fields within the target GAT entry.

Metablock to Physical Address Translation (STEP 880)

If a flag associated with the metablock address indicates that the metablock has been re-linked, the relevant LT sector is read from the BLM block, to determine the erase block address for the target sector address. Otherwise, the erase block address is determined directly from the metablock address.

Control Data Management

Figure 20:
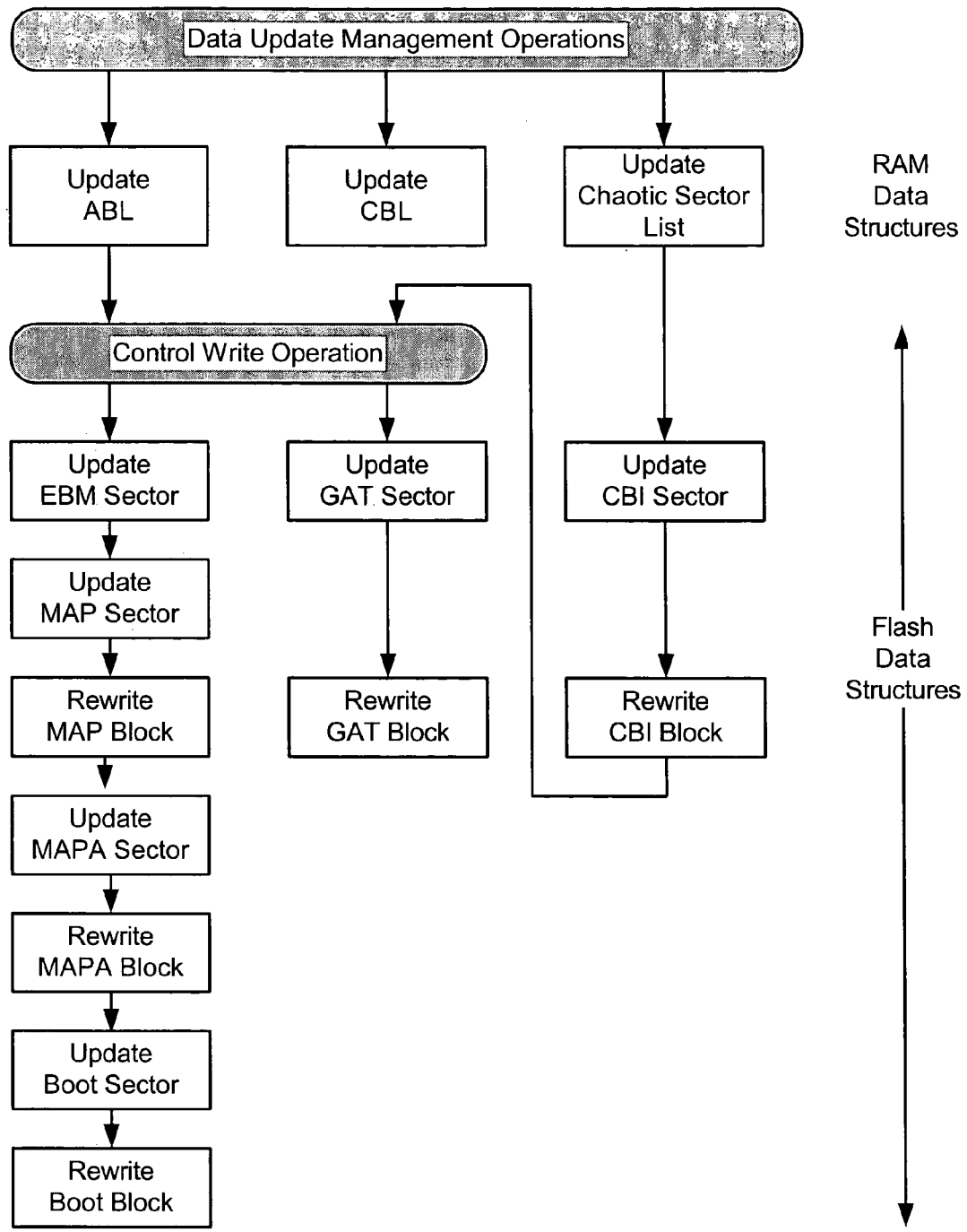
FIG. 20 illustrates the hierarchy of the operations performed on control data structures in the course of the operation of the memory management.

FIG. 20 illustrates the hierarchy of the operations performed on control data structures in the course of the operation of the memory management. Data Update Management Operations act on the various lists that reside in RAM. Control write operations act on the various control data sectors and dedicated blocks in flash memory and also exchange data with the lists in RAM.

Data update management operations are performed in RAM on the ABL, the CBL and the chaotic sector list. The ABL is updated when an erased block is allocated as an update block or a control block, or when an update block is closed. The CBL is updated when a control block is erased or when an entry for a closed update block is written to the GAT. The update chaotic sector list is updated when a sector is written to a chaotic update block.

A control write operation causes information from control data structures in RAM to be written to control data structures in flash memory, with consequent update of other supporting control data structures in flash memory and RAM, if necessary. It is triggered either when the ABL contains no further entries for erased blocks to be allocated as update blocks, or when the CBI block is rewritten.

In the preferred embodiment, the ABL fill operation, the CBL empty operation and the EBM sector update operation are performed during every control write operation. When the MAP block containing the EBM sector becomes full, valid EBM and MAP sectors are copied to an allocated erased block, and the previous MAP block is erased.

One GAT sector is written, and the Closed Update Block List is modified accordingly, during every control write operation. When a GAT block becomes full, a GAT rewrite operation is performed.

A CBI sector is written, as described earlier, after certain chaotic sector write operations. When the CBI block becomes full, valid CBI sectors are copied to an allocated erased block, and the previous CBI block is erased.

A MAP exchange operation, as described earlier, is performed when there are no further erased block entries in the EBB list in the EBM sector.

A MAP Address (MAPA) sector, which records the current address of the MAP block, is written in a dedicated MAPA block on each occasion the MAP block is rewritten. When the MAPA block becomes full, the valid MAPA sector is copied to an allocated erased block, and the previous MAPA block is erased.

A Boot sector is written in a current Boot block on each occasion the MAPA block is rewritten. When the boot block becomes full, the valid Boot sector is copied from the current version of the Boot block to the backup version, which then becomes the current version. The previous current version is erased and becomes the backup version, and the valid Boot sector is written back to it.

Although the various aspects of the present invention have been described with respect to certain embodiments, it is understood that the invention is entitled to protection within the full scope of the appended claims.

The Invention claimed is:

1. In a nonvolatile memory organized into a plurality of blocks, each block being a plurality of memory units that are erasable together, each memory unit for storing a logical unit of data, a method of storing and updating data in said memory comprising:

organizing data into a plurality of logical groups, each logical group partitioned into a plurality of logical units of data; each logical unit storable in a memory unit of a block;

storing all logical units of a given logical group among memory units of a first block according to a first order;

storing a series of updated logical units of said given logical group among memory units of a second block dedicated to said given logical group according to a second order, until a predetermined closure condition exists that closes said second block to storing further updates; and responsive to said second block being closed, either:

replacing said first block with said second block when said second and first orders are similar, or replacing said first block with a third block when said second and first orders are not similar, said third block having been consolidated according to said first order with a latest version of each logical unit of said given logical group gathered from said first and second blocks.

2. A method as in claim 1, further comprising:

responsive to said second block being closed and said second block containing distinct logical units less than a predetermined number, compacting to a fourth block a latest version of each logical unit from said second block; and replacing said second block with said fourth block as a dedicated block for storing updates of said given logical group.

3. A method as in claim 2, wherein said predetermined number of distinct logical units is half of the number of logical units in said given logical group.

4. A method as in claim 1, wherein said predetermined condition for closure is when said second block is full.

5. A method as in claim 1, wherein said predetermined condition for closure is when said second block has hitherto been storing the series of updates in an order similar to said first order but for the current update in the series, and said second block is at least half filled.

6. A method as in claim 5, wherein said second block is closed by having been consolidated according to said first order with a latest version of each logical unit of said given logical group gathered from said first and second blocks.

7. A method as in claim 1, wherein:

when said storing a series of updated logical units to said second block has hitherto been in an order similar to said first order but for a gap spanned by an address jump in the current update in the series, further includes:

filling said gap with logical units spanned by the address jump copied from said first block before storing the current update in the series.

8. A method as in claim 1, wherein:

when said storing a series of updated logical units to said second block has hitherto been in an order similar to said first order but for the current update in the series, further includes:

maintaining an index of updated logical units stored in said second block according to said second order.

9. A method as in claim 8, wherein said index is maintained in said nonvolatile memory.

10. A method as in claim 1, wherein said given logical group is one of multiple logical groups concurrently under updating by said method.

11. A method as in claim 1, wherein said nonvolatile memory has floating gate memory cells.

12. A method as in claim 1, wherein said nonvolatile memory is flash EEPROM.

13. A method as in claim 1, wherein said nonvolatile memory is NROM.

14. A method as in claim 1, wherein said nonvolatile memory is a memory card.

15. A method as in any one of claim 1–4, wherein said nonvolatile memory has memory cells that each stores one bit of data.

16. A method as in any one of claim 1–14, wherein said nonvolatile memory has memory cells that each stores more than one bit of data.

17. A nonvolatile memory comprising:

a memory organized into a plurality of blocks, each block being a plurality of memory units that are erasable together, each memory unit for storing a logical unit of data;

a controller for controlling operations of said blocks;

said controller storing all logical units of a given logical group thereof among memory units of a first block according to a first order;

said controller storing a series of updated logical units of said given logical group among memory units of a second block dedicated to said given logical group according to a second order until a predetermined closure condition exists that closes said second block to storing further updates; and responsive to said second block being closed, said controller either:

replacing said first block with said second block when said second and first orders are similar, or replacing said first block with a third block when said second and first orders are not similar, said third block having been stored by said controller according to said first order a latest version of each logical unit of said given logical group gathered from said first and second blocks.

18. A nonvolatile memory as in claim 17, further comprising:

responsive to said second block being closed and said second block containing distinct logical units less than a predetermined number, said controller storing to a fourth block a latest version of each logical unit from said second block; and replacing said second block with said fourth block as a dedicated block for storing updates of said given logical group.

19. A nonvolatile memory as in claim 18, wherein said predetermined number of distinct logical units is half of the number of logical units in said given logical group.

20. A nonvolatile memory as in claim 17, wherein said predetermined condition for closure is when said second block is full.

21. A nonvolatile memory as in claim 17, wherein said predetermined condition for closure is when said second block has hitherto been storing the series of updates in an order similar to said first order but for the current update in the series, and said second block is at least half filled.

22. A nonvolatile memory as in claim 21, wherein said second block is closed by having been consolidated according to said first order with a latest version of each logical unit of said given logical group gathered from said first and second blocks.

23. A nonvolatile memory as in claim 17, wherein:
when said storing a series of updated logical units to said second block has hitherto been in an order similar to said first order but for a gap spanned by an address jump in the current update in the series, further includes:
filling said gap with logical units spanned by the address jump copied from said first block before storing the current update in the series.

24. A nonvolatile memory as in claim 17, wherein:
when said storing a series of updated logical units to said second block has hitherto been in an order similar to said first order but for the current update in the series, further includes:
maintaining an index of updated logical units stored in said second block according to said second order.

25. A nonvolatile memory as in claim 24, wherein said index is maintained in said nonvolatile memory.

26. A nonvolatile memory as in claim 17, wherein said given logical group is one of multiple logical groups concurrently under updating by said method.

27. A nonvolatile memory as in claim 17, wherein said nonvolatile memory has floating gate memory cells.

28. A nonvolatile memory as in claim 17, wherein said nonvolatile memory is flash EEPROM.

29. A nonvolatile memory as in claim 17, wherein said nonvolatile memory is NROM.

30. A nonvolatile memory as in claim 17, wherein said nonvolatile memory is a memory card.

31. A nonvolatile memory as in any one of claim 17–30, wherein said nonvolatile memory has memory cells that each stores one bit of data.

32. A nonvolatile memory as in any one of claim 17–30, wherein said nonvolatile memory has memory cells that each stores more than one bit of data.

* * * * *